United States Patent [19]

Tamamura et al.

[11] Patent Number: 5,321,733
[45] Date of Patent: Jun. 14, 1994

[54] COUNTER CIRCUIT USING JOHNSON-TYPE COUNTER AND APPLIED CIRCUIT INCLUDING THE SAME

[75] Inventors: Masaya Tamamura; Shinichi Shiotsu; Katsunobu Nomura, all of Kawasaki, Japan

[73] Assignee: Fujitsu Limited, Kawasaki, Japan

[21] Appl. No.: 928,469

[22] Filed: Aug. 12, 1992

[30] Foreign Application Priority Data

Aug. 12, 1991 [JP] Japan .................................. 3-201771
Aug. 6, 1992 [JP] Japan .................................. 4-209991

[51] Int. Cl.⁵ ............................................. H03K 21/02
[52] U.S. Cl. ..................................... 377/44; 377/33; 377/37; 377/67
[58] Field of Search .................... 377/33, 37, 44, 67

[56] References Cited

U.S. PATENT DOCUMENTS 4,339,722 7/1982 Sydor et al. ........................ 377/44
4,519,091 5/1985 Chu et al. .......................... 377/37

FOREIGN PATENT DOCUMENTS 0326856 8/1989 European Pat. Off. .
0404127 12/1990 European Pat. Off. .
0454153 10/1991 European Pat. Off. .
3-22712 1/1991 Japan .

Primary Examiner—Margaret R. Wambach
Attorney, Agent, or Firm—Staas & Halsey

[57] ABSTRACT

A counter circuit includes Johnson-type counters of m stages, each counter including a plurality of flip-flops connected in a cascade connection, each flip-flop receiving a clock signal at a respective clock input end. In the constitution, signals at respective output ends of flip-flops in a (k−1)-th stage counter are simultaneously input to respective clock input ends of flip-flops in each counter of a k-th stage and more. As a result, it is possible to obtain a signal having an arbitrary ratio of frequency division with high speed, while relatively simplifying the circuit constitution.

23 Claims, 35 Drawing Sheets

COUNTER CIRCUIT USING JOHNSON-TYPE COUNTER AND APPLIED CIRCUIT INCLUDING THE SAME

BACKGROUND OF THE INVENTION

1. Field of the Invention

The present invention relates to a counter circuit, and more particularly, to a counter circuit using a Johnson-type counter and to applications thereof.

The counter circuit and its applied circuits according to the present invention can be utilized in various digital applied circuits which frequently need operations for converting a chain of serial data into parallel data of a plurality of bits, or converting parallel data of a plurality of bits into a chain of serial data.

2. Description of the Related Art

With a recent demand for high speed operation of various digital applied circuits or systems, a development of integrated circuits (IC) which can effect perform signal processing with high speed has been, demanded. To this end, it is necessary to achieve high speed operations of the individual, respective circuits within the IC.

As an example of a counter circuit using a Johnson-type counter, a 1/N frequency-dividing circuit including a plurality of flip-flops connected in a cascade connection is known. In this constitution, the first stage flip-flop receives a clock signal and the last stage flip-flop outputs a 1/N divided signal. Accordingly, the 1/N divided signal cannot be obtained until the clock signal is applied and then passed through the flip-flops of the plurality of stages. Namely, it takes considerable time, corresponding to an operation delay time of the flip-flops, to obtain the 1/N divided signal. This is disadvantageous from a viewpoint of the operation speed.

Also, since the flip-flops are connected in a cascading manner, drawback arises in that the ratio of frequency division is fixed depending on the number of flip-flops used.

As another example of a counter circuit using a Johnson-type counter, a divided signal generating circuit effecting a logical-OR operation is known. In this case, each signal input to the OR logic portion needs an input amplitude of a predetermined level. However, when the input amplitude is increased, a problem occurs in that the operation delay time of each flip-flop is prolonged. This leads to a lowering of the maximum operating frequency of the Johnson-type counter and therefore, make this type of counter circuit undesirable.

The problems in the prior art will be explained later in detail in contrast with the preferred embodiments of the present invention.

SUMMARY OF THE INVENTION

An object of the present invention is to provide a counter circuit which can obtain a signal having an arbitrary ratio of frequency division with at high speed, while relatively simplifying the circuit constitution.

Another object of the present invention is to provide a counter circuit using a Johnson-type counter which can increase a maximum operation frequency thereof and thus realize a higher speed operation.

Still another object of the present invention is to provide various applied circuits using the counter circuit.

According to one aspect of the present invention, there is provided a counter circuit including: Johnson-type counters of m stages, each counter including a plurality of flip-flops connected in a cascade connection, each flip-flop receiving a clock signal at a respective clock input end, wherein signals at respective output ends of flip-flops in a (k−1)-th stage counter are simultaneously input to respective clock input ends of flip-flops in each counter of a k-th stage and more.

Also, according to another aspect of the present invention, there is provided a counter circuit including: Johnson-type counters of m stages, each counter including a plurality of flip-flops connected in a cascade connection; and (m−1) logic gates connected between each stage of the Johnson-type counters, wherein a clock signal is simultaneously input to respective clock input ends of flip-flops in a first stage counter; a logic sum of the clock signal and signals at respective output ends of flip-flops in the first stage counter is generated by a first logic gate and output as a first signal; the first signal is simultaneously input to respective clock input ends of flip-flops in a second stage counter; a logic sum of the first signal and signals at respective output ends of flip-flops in the second stage counter is generated by a second logic gate and output as a second signal; and, hereinafter in the like manner, a (m−1)-th signal is simultaneously input to respective clock input ends Of flip-flops in a m-th stage counter.

Also, according to still another aspect of the present invention, there is provided a counter circuit including: a Johnson-type counter including a plurality of flip-flops connected in a cascade connection, each flip-flop simultaneously receiving a clock signal at a respective clock input end; and a gate unit for generating a logic sum of the clock signal and signals at respective output ends of the flip-flops in the counter, the Johnson-type counter including a buffer unit for regulating respective timings at which the clock signal and the signals at the respective output ends of each flip-flop are input to the gate unit, non-inverting and inverting outputs of a last stage flip-inverting input ends of a first stage flip-flop, respectively, and operation amplitude levels of respective differential signal outputs of the flip-flops being set to be smaller than those of other circuits.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Throughout the description, identical references used in connection with the drawings indicate like constituent elements and thus the explanation thereof will not be repeated.

First, for a better understanding of the preferred embodiments of the present invention, the related prior art will be explained with reference to FIGS. 1 to 10.

Figure 1:
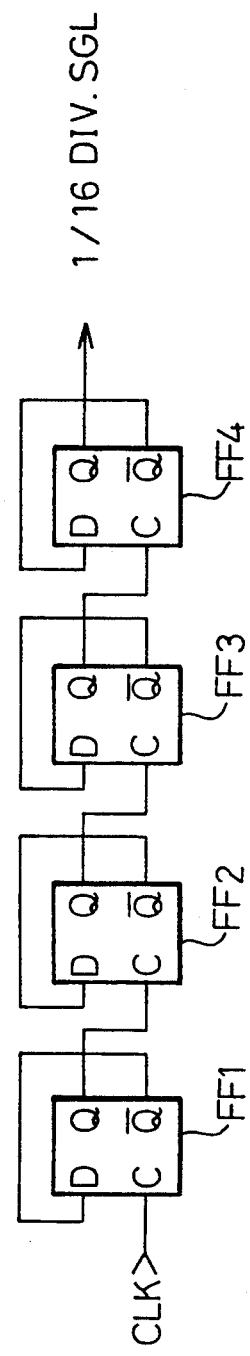
FIG. 1 is a circuit diagram showing a constitution of a prior art 1/16 frequency-dividing circuit.
Figure 2:
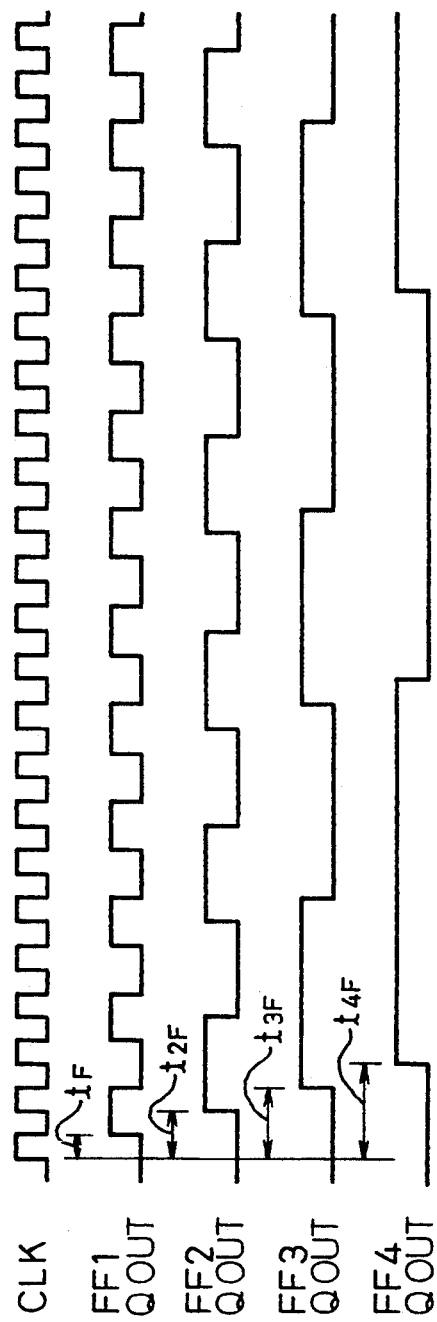
FIG. 2 is a timing chart representing the operation of the circuit of FIG. 1.

FIG. 1 illustrates a constitution of a prior art 1/16 frequency-dividing circuit, and FIG. 2 shows a timing chart representing the operation thereof.

The circuit of FIG. 1 includes four flip-flops FF1 to FF4. The first stage flip-flop FF1 receives a clock signal CLK at a clock input end C and, hereinafter in the like manner, the following stage flip-flop receives a signal at the clock input end C from an output end Q of the preceding stage flip-flop. Finally, the last stage flip-flop FF4 outputs a 1/16 divided signal from the output end Q. Accordingly, as shown in the timing chart of FIG. 2, time taken until the 1/16 divided signal is obtained from the application of the clock signal CLK is $t_{4F}$, which corresponds to an operation delay time of the flip-flops of four stages.

Figure 3:
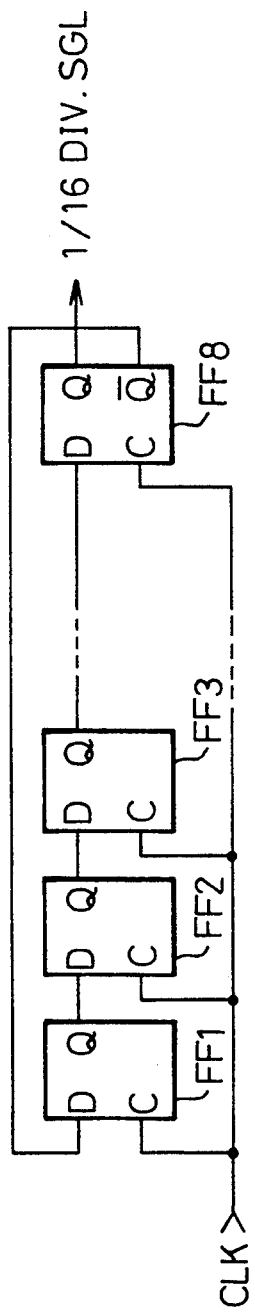
FIG. 3 is a circuit diagram showing a constitution of another prior art 1/16 frequency-dividing circuit.
Figure 4:
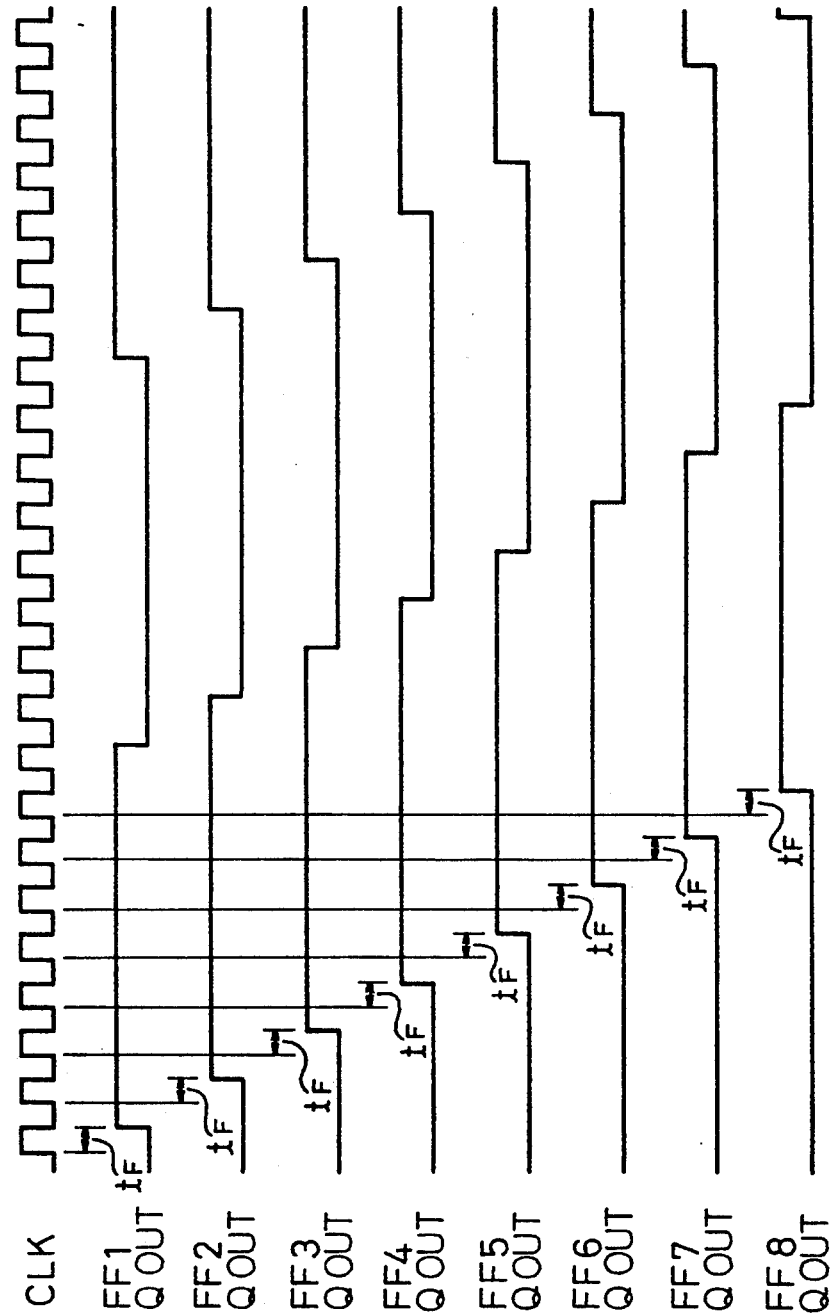
FIG. 4 is a timing chart representing the operation of the circuit of FIG. 3.

FIG. 3 illustrates a constitution of another prior art 1/16 frequency-dividing circuit, and FIG. 4 shows a timing chart representing the operation thereof.

The circuit of FIG. 3 has a form of a Johnson-type counter including eight flip-flops FF1 to FF8 connected in a cascade connection. Each flip-flop simultaneously receives a clock signal CLK at a respective clock input end C and the last stage flip-flop FF8 outputs a 1/16 divided signal from the output end Q. According to this constitution, and as shown in the timing chart of FIG. 4, the elapsed time taken from the application of the clock signal CLK to the time when a 1/16 divided signal is obtained is no more than $t_f$, which corresponds corresponding to an operation delay time of the flip-flop of one stage. On the other hand, the number of flip-flops used in the constitution is no less than eight.

Figure 5:
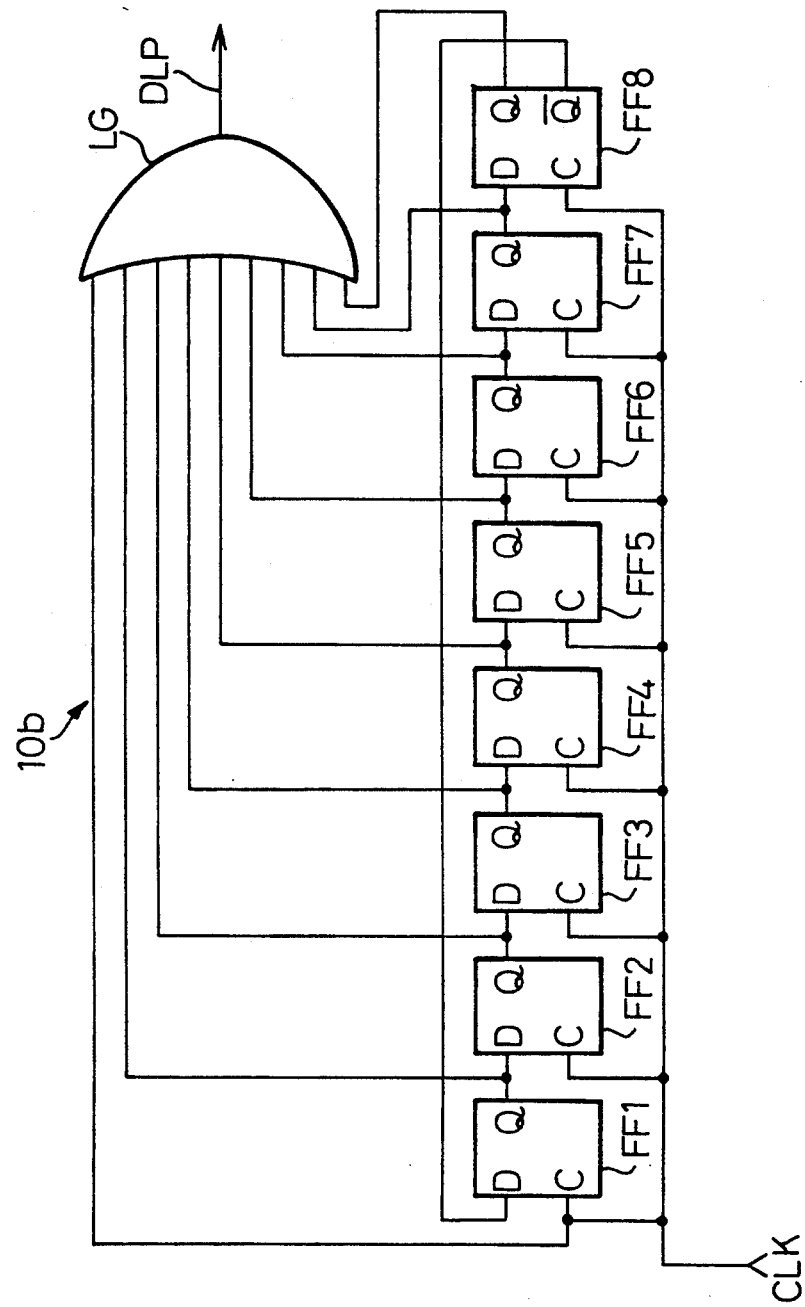
FIG. 5 is a circuit diagram showing a constitution of a prior art divided signal generating circuit.
Figure 6:
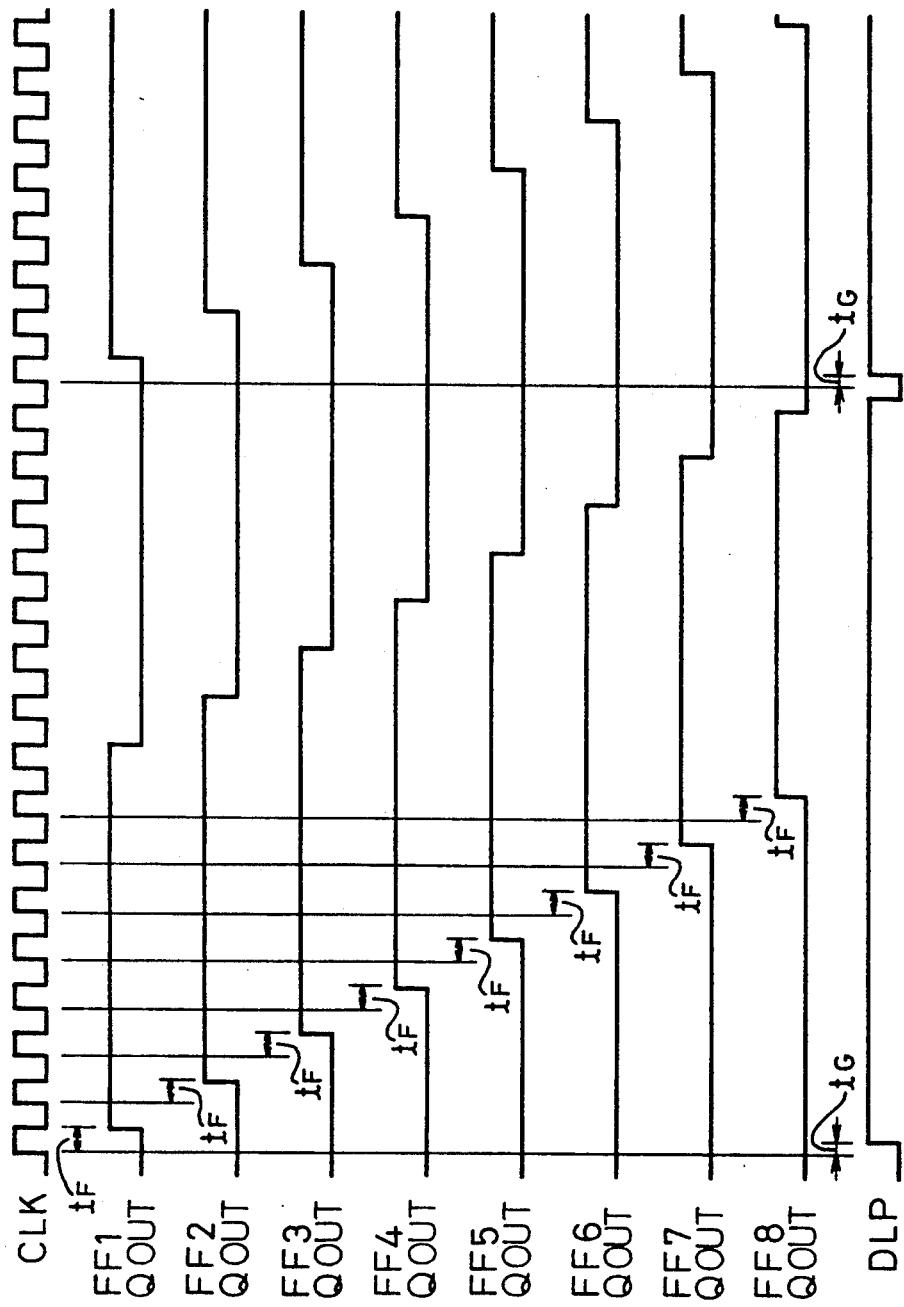
FIG. 6 is a timing chart representing the operation of the circuit of FIG. 5.

FIG. 5 illustrates a constitution of a prior art divided signal generating circuit, and FIG. 6 shows a timing chart representing the operation thereof.

The illustrated circuit 10b includes a logical OR gate LG in addition to the 1/16 frequency-dividing circuit of FIG. 3. The OR gate LG generates a logic sum of the clock signal CLK and signals at respective output ends Q of all of the flip-flops FF1 to FF8 and as a result outputs a data load pulse DLP. According to the constitution, and as shown in the timing chart of FIG. 6, time taken until the data load pulse DLP is obtained from the application of the clock signal CLK is no more than $t_G$, which corresponds to an operation delay time of the gate of one stage. On the other hand, the number of flip-flops used in the constitution is no less than eight.

Figure 7:
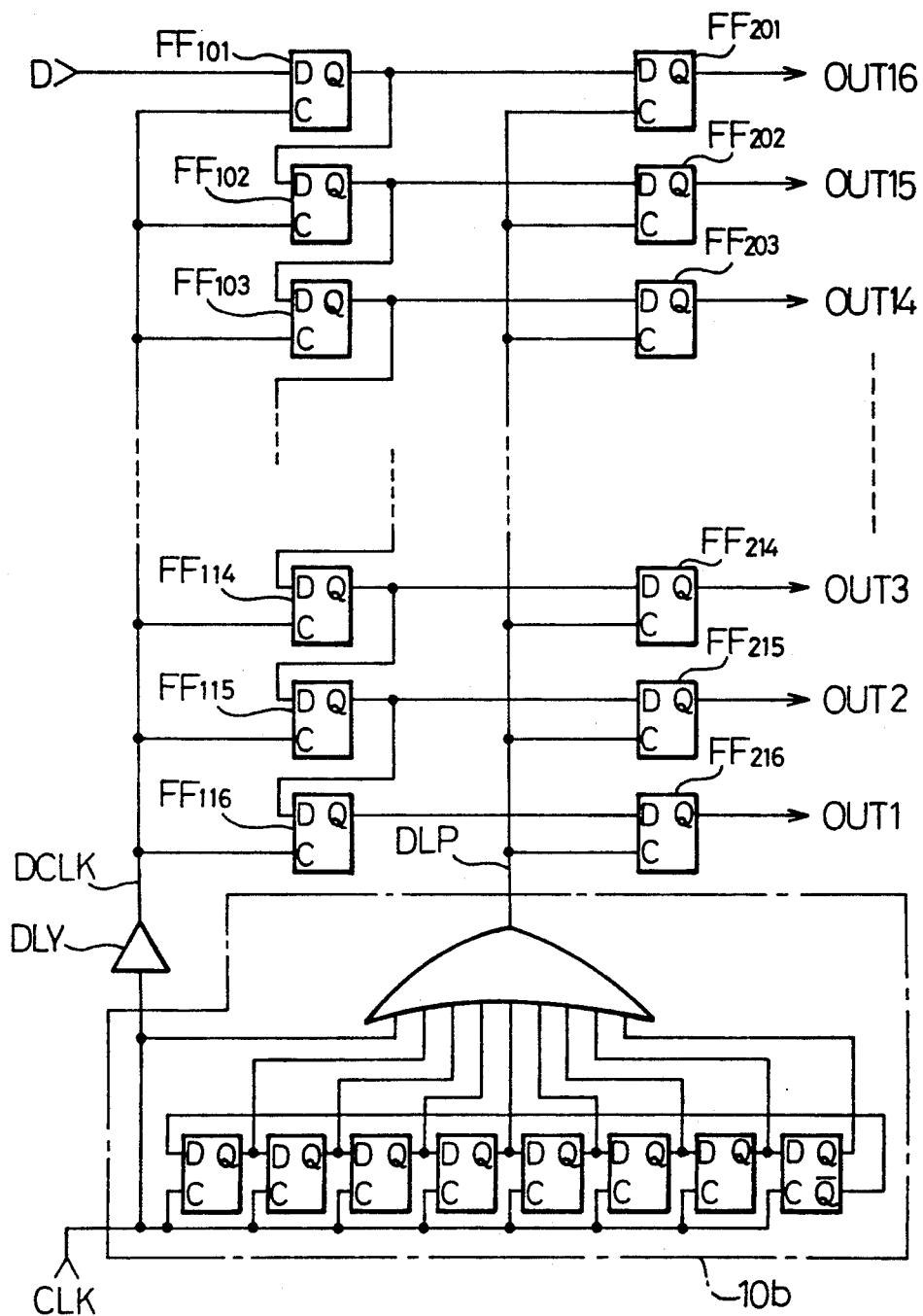
FIG. 7 is a circuit diagram showing a constitution of a prior art 16-bit data demultiplexer circuit.
Figure 8:
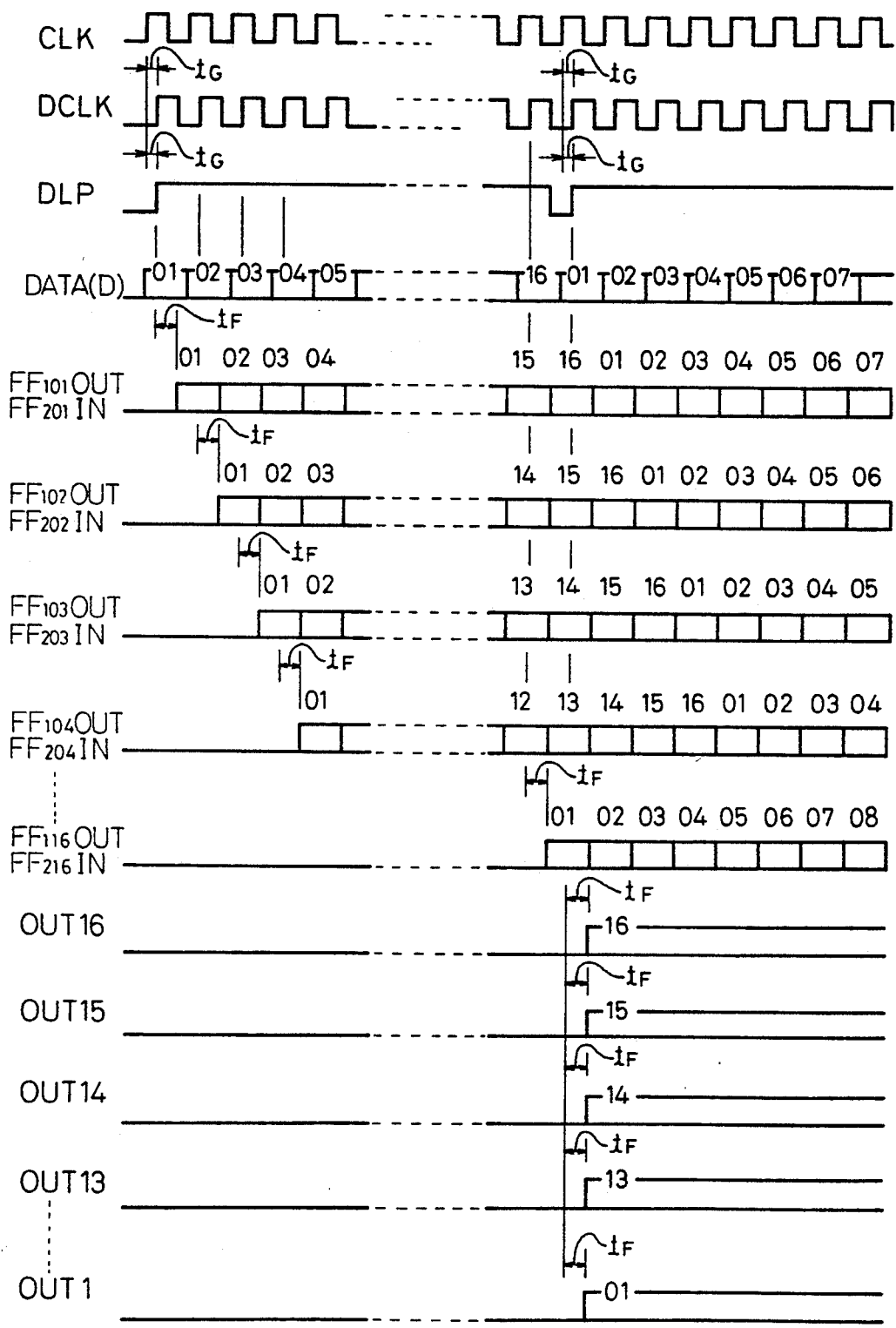
FIG. 8 is a timing chart representing the operation of the circuit of FIG. 7.

FIG. 7 illustrates a constitution of a prior art 16-bit data demultiplexer circuit, and FIG. 8 shows a timing chart representing the operation thereof.

The illustrated circuit includes the divided signal generating circuit $10b$ of FIG. 5, a delay circuit DLY for generating a delayed clock signal DCLK in response to the clock signal CLK, a serial/parallel converting circuit having sixteen flip-flops $FF_{101}$ to $FF_{116}$ connected in a cascade connection, and a latch circuit having sixteen flip-flops $FF_{201}$ to $FF_{216}$, each flip-flop responsive to the data load pulse DLP output from the divided signal generating circuit $10b$, latching respective outputs of the serial/parallel converting circuit and outputting the latched data as parallel data OUT16 to OUT1. The delay circuit DLY has the function of delaying the clock signal CLK by a predetermined delay time corresponding to the number of stage of gates and outputting the delayed clock signal DCLK. Also, the divided signal generating circuit $10b$ has the function of outputting the data load pulse DLP at an appropriate timing after data is set in the flip-flops $FF_{201}$ to $FF_{216}$ of the latch circuit. Namely, the serial/parallel converting circuit sequentially inputs a chain of serial data D in response to the delayed clock signal DCLK, and outputs the parallel data OUT16 to OUT1 in response to the data load pulse DLP and holds the parallel data until a next 16-bit data is input thereto. An example of the art is disclosed, for example, in Japanese unexamined patent publication No. 3-22712.

Figure 9:
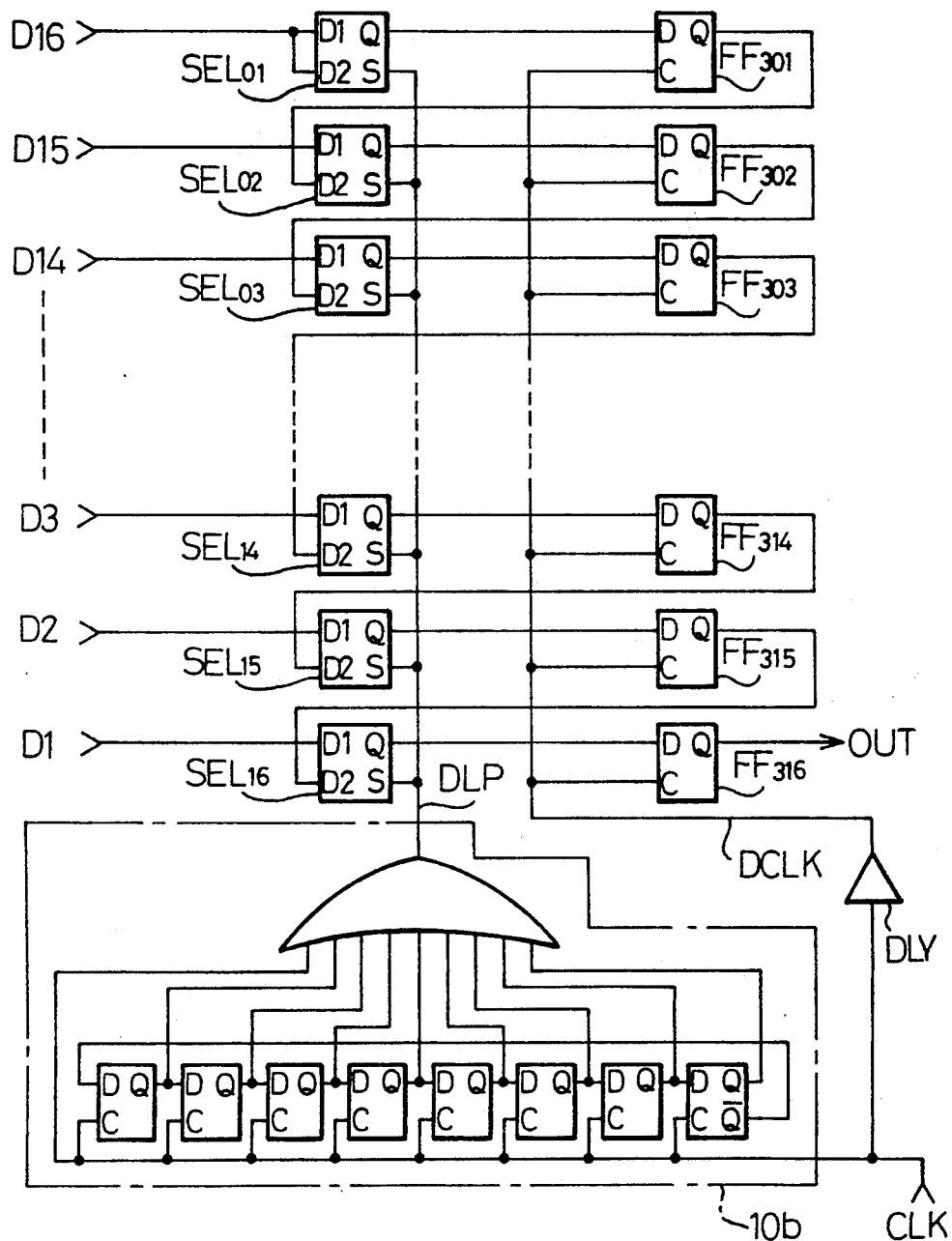
FIG. 9 is a circuit diagram showing a constitution of a prior art 16-bit data multiplexer circuit.
Figure 10:
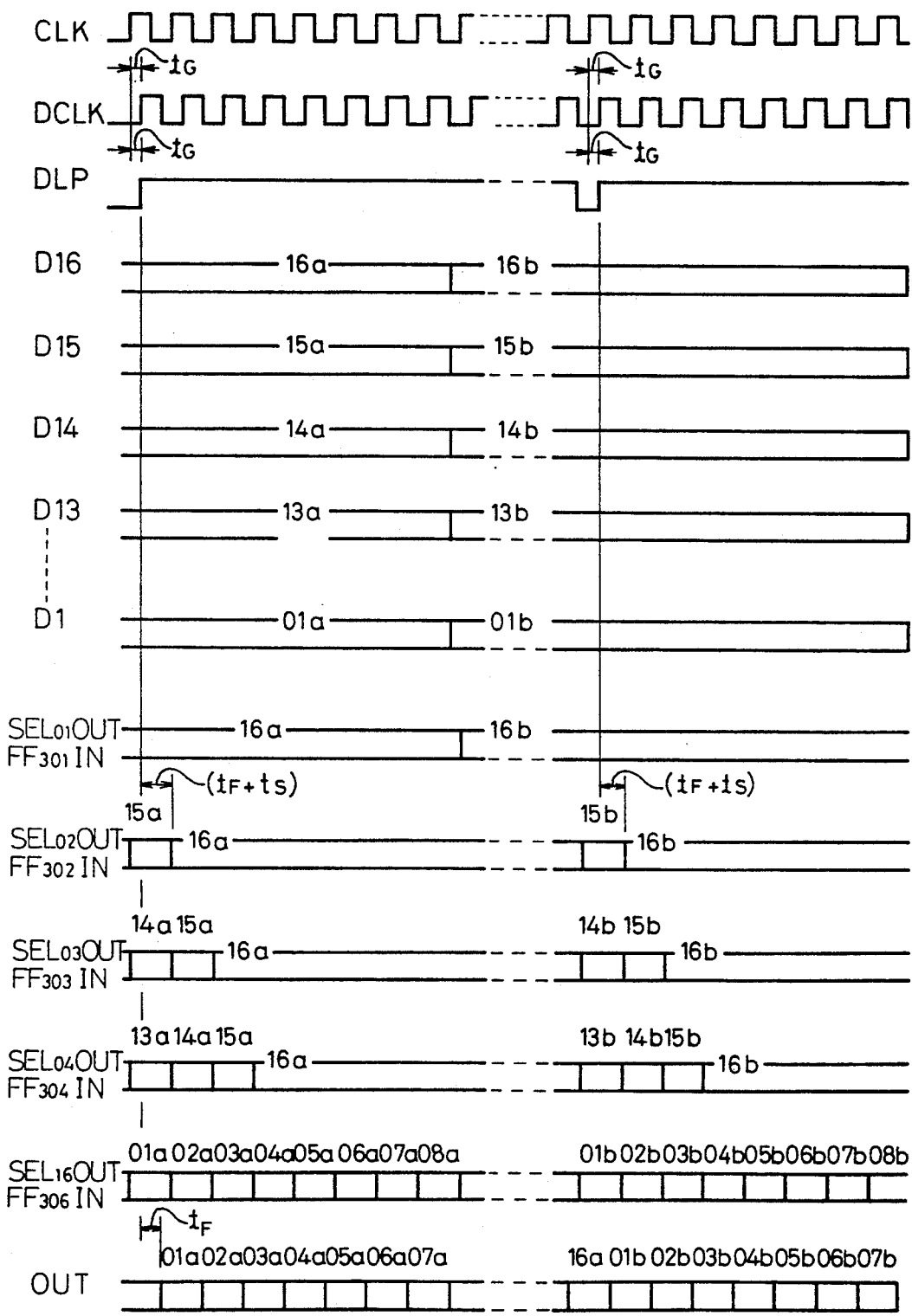
FIG. 10 is a timing chart representing the operation of the circuit of FIG. 9.

FIG. 9 illustrates a constitution of a prior art 16-bit data multiplexer circuit, and FIG. 10 shows a timing chart representing the operation thereof.

The illustrated circuit includes the divided signal generating circuit $10b$ of FIG. 5, a delay circuit DLY for generating a delayed clock signal DCLK in response to the clock signal CLK, and a parallel/serial converting circuit having sixteen selectors $SEL_{01}$ to $SEL_{16}$ and sixteen flip-flops $FF_{301}$ to $FF_{316}$ connected sequentially and alternately to one another. The delay circuit DLY has the function of delaying the clock signal CLK by a predetermined delay time corresponding to the number of stage of gates and outputting the delayed clock signal DCLK. Also, the divided signal generating circuit $10b$ has the function of outputting the data load pulse DLP when new 16-bit data is taken into the parallel/serial converting circuit by the selectors $SEL_{01}$ to $SEL_{16}$. Namely, the parallel/serial converting circuit inputs a 16-bit data by means of the selectors $SEL_{01}$ to $SEL_{16}$ in response to the data load pulse DLP and then, in response to the delayed clock signal DCLK, outputs the 16-bit parallel data as a chain of serial data OUT, bit by bit.

According to the prior art constitution of FIG. 1, the 1/16 divided signal cannot be obtained until the clock signal CLK is applied to the first stage flip-flop FF1 and then passed through the flip-flops of four stages (FF1 to FF4). Namely, it takes the time $t_{4F}$, corresponding to the operation delay time of the flip-flops of four stages, to obtain the 1/16 divided signal. This is disadvantageous from a viewpoint of the operation speed.

Also, since the flip-flops are connected in the cascade connection, a problem occurs in that the ratio of frequency division is fixed depending on the number of flip-flops used. This imposes a restriction on the utilization or application of the frequency-dividing circuit due to the frequency being fixed, and thus is not preferable.

Although the prior art constitution of FIG. 3 has an advantage in that it is possible to obtain the 1/16 divided signal with higher speed than in the circuit constitution of FIG. 1, the constitution of FIG. 3 poses a problem in that the circuit constitution relatively becomes complicated because the number of use of the flip-flops is more than that in FIG. 1.

Furthermore, similar problems are present in the prior art divided signal generating circuit $10b$ of FIG. 5 which uses the counter circuit (1/16 frequency-dividing circuit) containing the above problems, the prior art data demultiplexer circuit of FIG. 7 using the divided signal generating circuit $10b$, and the prior art data multiplexer circuit of FIG. 9 using the divided signal generating circuit $10b$.

Also, according to the prior art constitution using a Johnson-type counter effecting a logical OR operation as shown in FIG. 5, respective signals input to the OR logic portion (OR gate LG), i.e., the clock signal CLK and the signals at the respective output ends Q of the flip-flops FF1 to FF8, need an input amplitude of sufficient level as compared with a reference level within the OR gate LG. In this case, the operation delay time of each flip-flop depends upon a magnitude of the input amplitude. Therefore, a problem occurs in that the operation delay time of each flip-flop is prolonged where the input amplitude is increased. As a result, a maximum operation frequency of the Johnson-type counter is lowered and thus an operation speed of the entire circuit is decreased.

Figure 11:
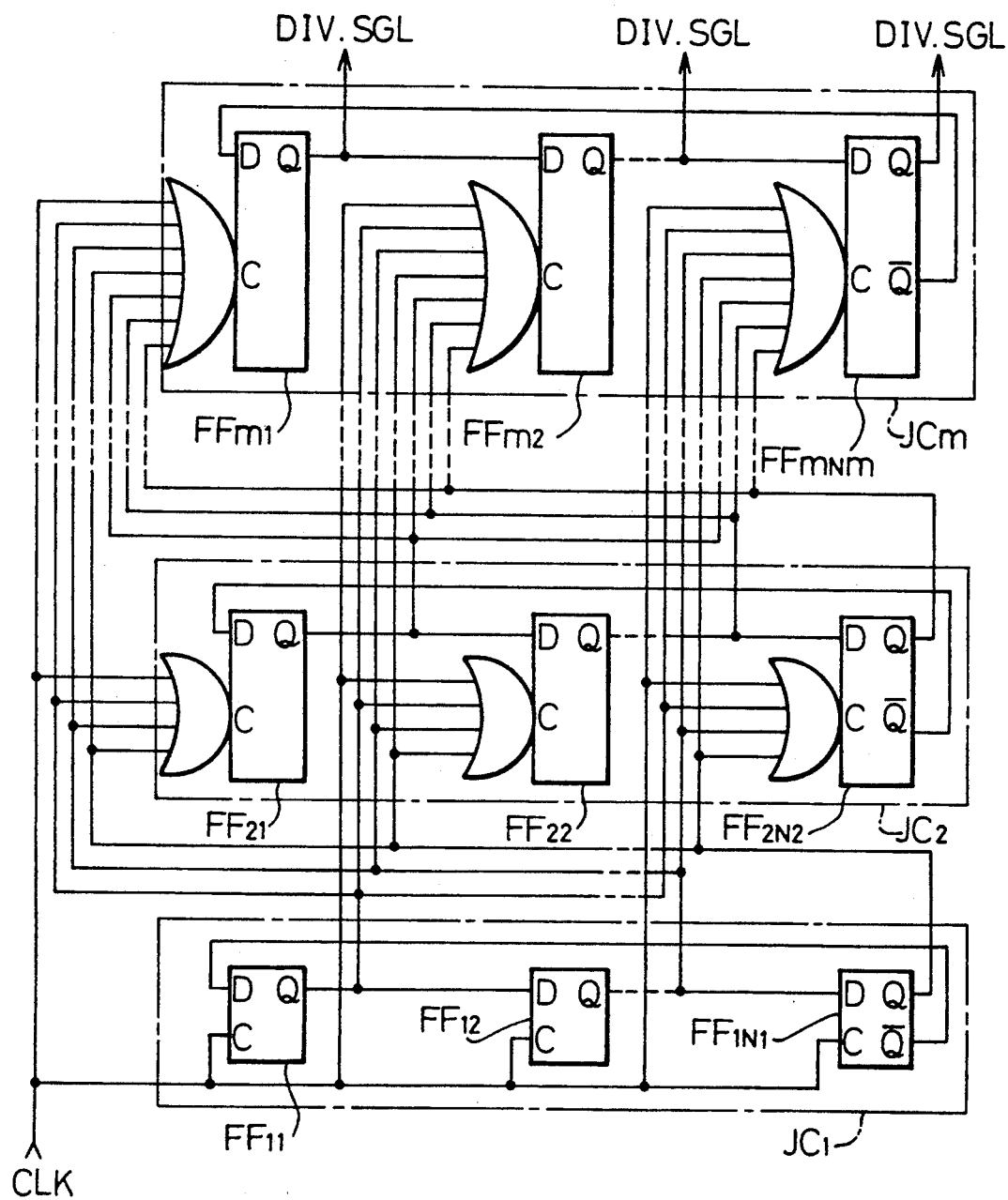
FIG. 11 is a circuit diagram showing a fundamental constitution of the counter circuit according to a first aspect of the present invention.

FIG. 11 illustrates a fundamental constitution of a counter circuit according to a first aspect of the present invention.

The illustrated circuit includes Johnson-type counters $JC_1 \sim JC_m$ of m stages, each counter including a plurality of flip-flops $FF_{11} \sim FF_{1N1}, FF_{21} \sim FF_{2N2}, \ldots, FF_{m1} \sim FF_{mNm}$ connected in a cascade connection. Each flip-flop receives a clock signal CLK at a respective clock input end C, wherein signals at respective output ends Q of flip-flops in a (k−1)-th stage counter are simultaneously input to respective clock input ends C of flip-flops in each counter of a k-th stage through the m-th stage.

Figure 12:
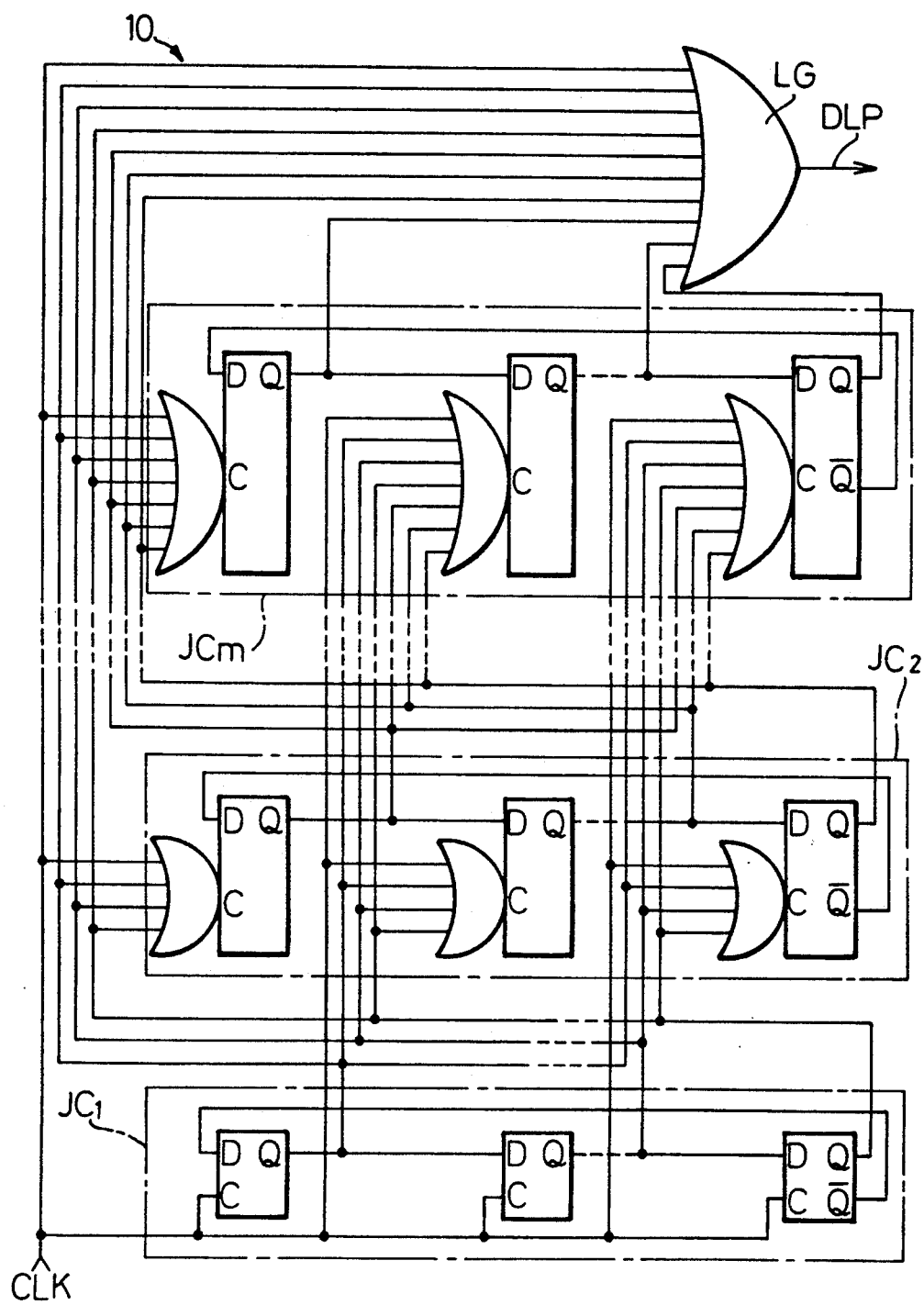
FIG. 12 is a circuit diagram showing a fundamental constitution of the divided signal generating circuit according to a second aspect of the present invention.

FIG. 12 illustrates a fundamental constitution of the divided signal generating circuit according to a second aspect of the present invention.

The illustrated circuit includes the counter circuit shown in FIG. 11, and a logic gate LG which generates a logic sum of the clock signal and signals at respective output ends of all of the flip-flops in the counter circuit and, a result thereof outputs a m-th signal.

Figure 13:
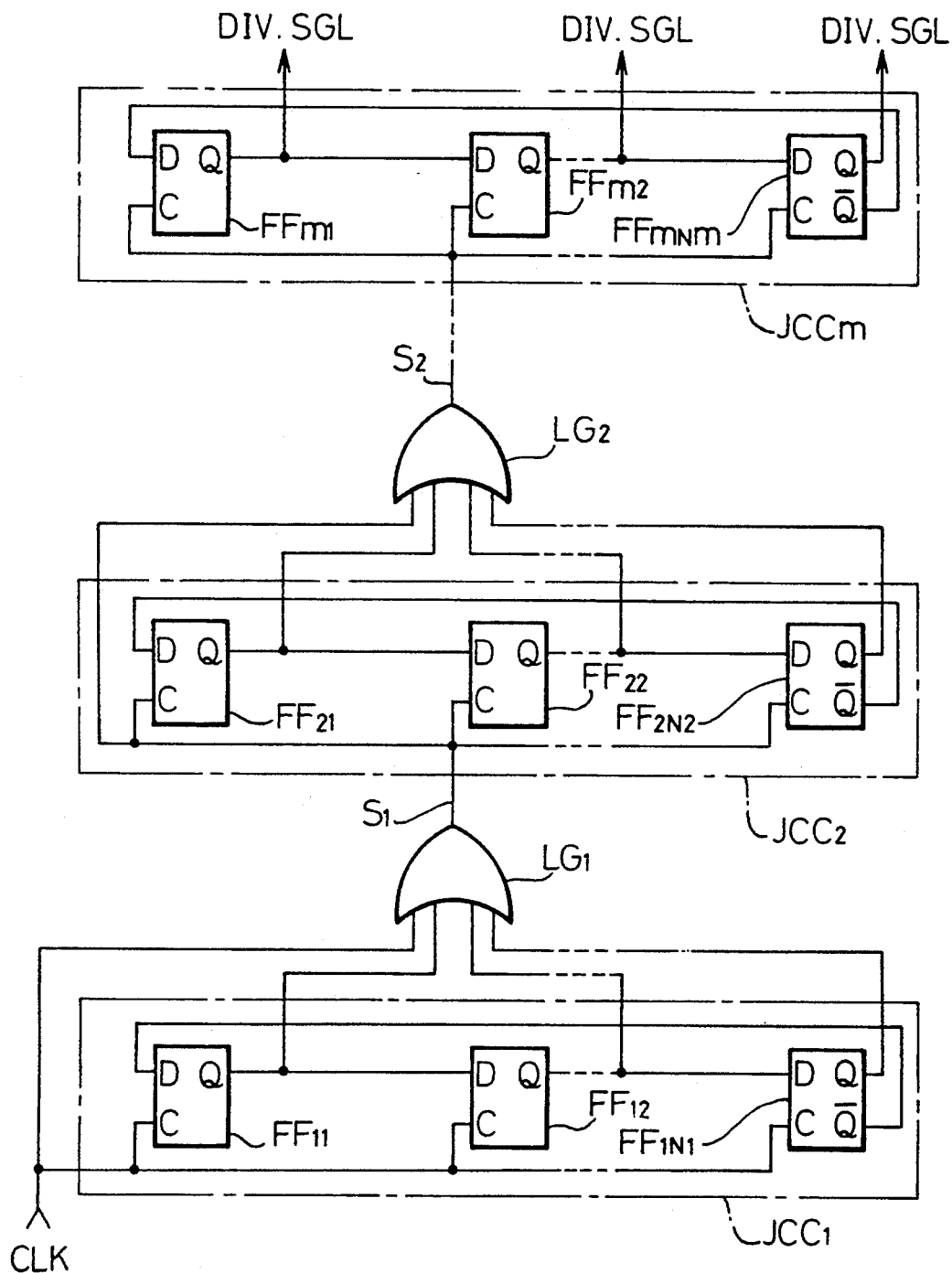
FIG. 13 is a circuit diagram showing a fundamental constitution of the counter circuit according to a third aspect of the present invention.

FIG. 13 illustrates a fundamental constitution of the counter circuit according to a third aspect of the present invention.

The illustrated circuit includes Johnson-type counters $JCC_1 \sim JCC_m$ of m stage, each counter including a plurality of flip-flops $FF_{11} \sim FF_{1N1}, FF_{21} \sim FF_{2N2}, \ldots, FF_{m1} \sim FF_{mNm}$ connected in a cascade connection, and (m−1) logic gates $LG_1 \sim LG_{m-1}$ connected between each stage of the Johnson-type counters, wherein a clock signal CLK is simultaneously input to respective clock input ends C of flip-flops in a first stage counter $JCC_1$; a logic sum of the clock signal and signals at respective output ends Q of flip-flops in the first stage counter is generated by a first logic gate $LG_1$, which outputs a first signal $S_1$; the first signal $S_1$ is simultaneously input to respective clock input ends C of flip-flops in a second stage counter $JCC_2$; a logic sum of the first signals, and signals at respective output ends Q of flip-flops in the second stage counter is generated by a second logic gate LG$_2$, which outputs a second signal S$_2$; and, hereinafter in the like manner, a (m−1)-th signal S$_{m-1}$ is simultaneously input to respective clock input ends C of flip-flops in a m-th stage counter JCCm.

Figure 14:
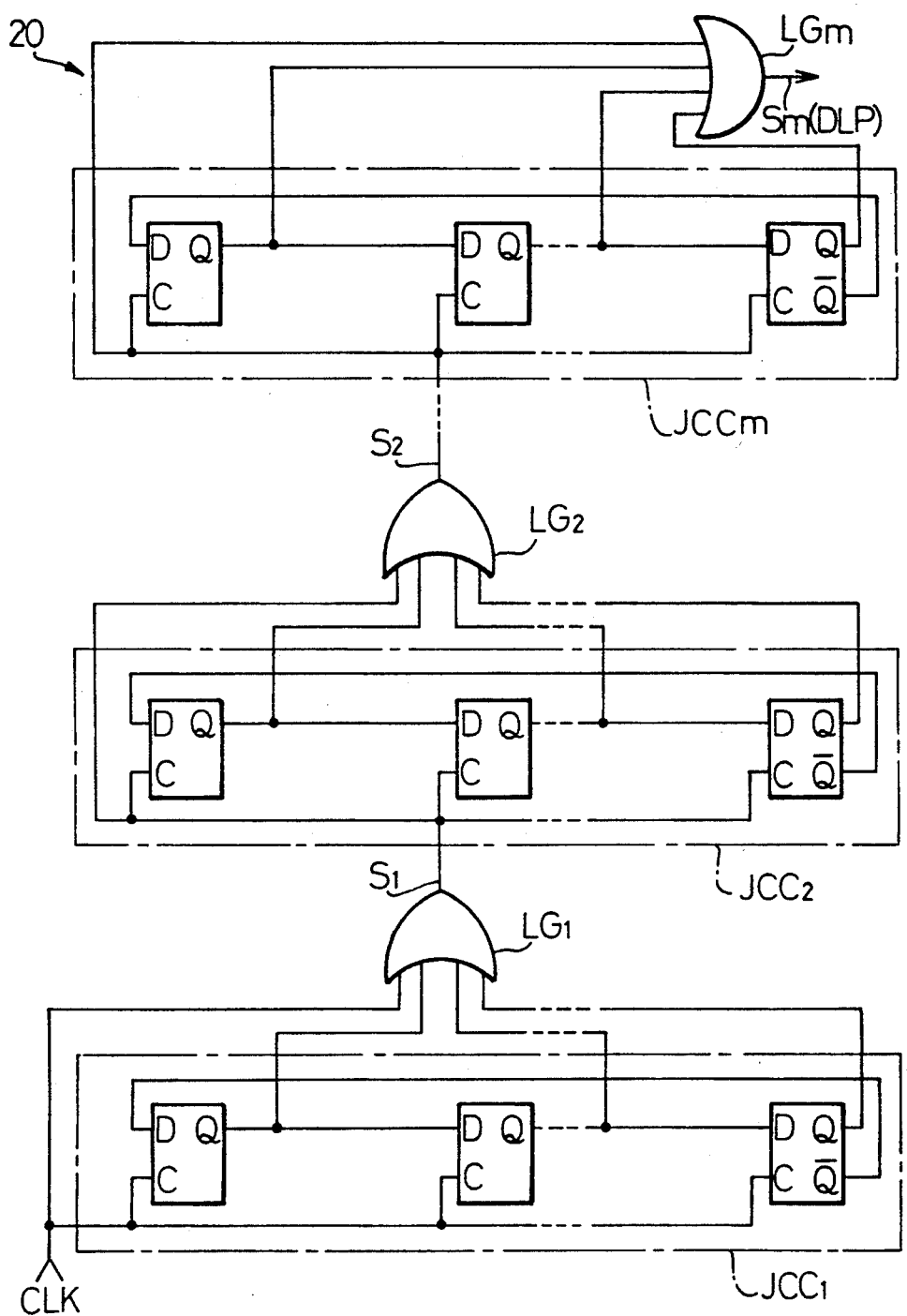
FIG. 14 is a circuit diagram showing a fundamental constitution of the divided signal generating circuit according to a fourth aspect of the present invention.

FIG. 14 illustrates a fundamental constitution of the divided signal generating circuit according to a fourth aspect of the present invention.

The illustrated circuit includes the counter circuit shown in FIG. 13, and a logic gate LGm which generates a logic sum of the (m−1)-th signal and signals at respective output ends of flip-flops in the m-th stage counter and, as a result thereof as a m-th signal Sm (DLP).

Figure 15:
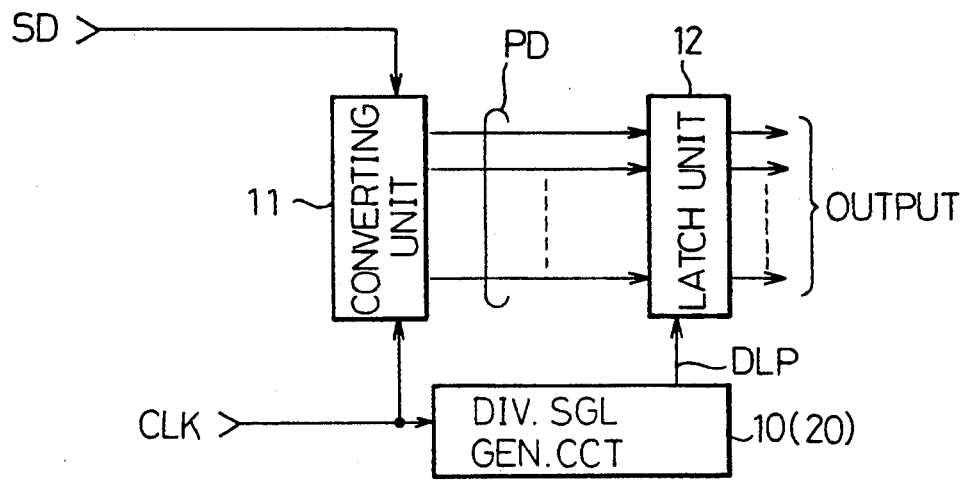
FIG. 15 is a block diagram showing a fundamental constitution of the data converting circuit according to a fifth aspect of the present invention.

FIG. 15 illustrates a fundamental constitution of the data converting circuit according to a fifth aspect of the present invention.

The illustrated circuit includes the divided signal generating circuit 10 (20) shown in FIG. 12 or FIG. 14, respectively, a unit 11 for inputting a serial data SD in response to the clock signal CLK and converting the serial data into a parallel data PD of a plurality of bits, and a unit 12 for latching and outputting the parallel data in response to the m-th signal DLP output from the divided signal generating circuit.

Figure 16:
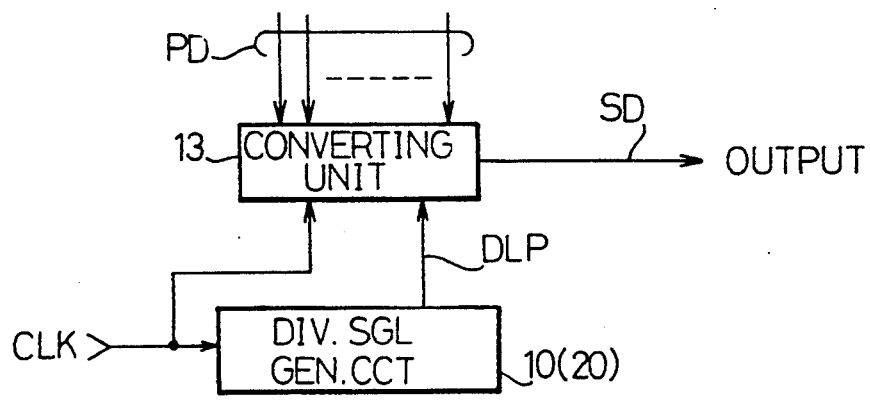
FIG. 16 is a block diagram showing a fundamental constitution of the data converting circuit according to a sixth aspect of the present invention.

FIG. 16 illustrates a fundamental constitution of the data converting circuit according to a sixth aspect of the present invention.

The illustrated circuit includes the divided signal generating circuit 10 (20) shown in FIG. 12 or FIG. 14, and a unit 13, receiving parallel data PD of a plurality of bits in response to the m-th signal DLP output from the divided signal generating circuit, for converting the parallel data into a serial data SD in response to the clock signal CLK, thereby outputting the converted serial data.

Figure 17:
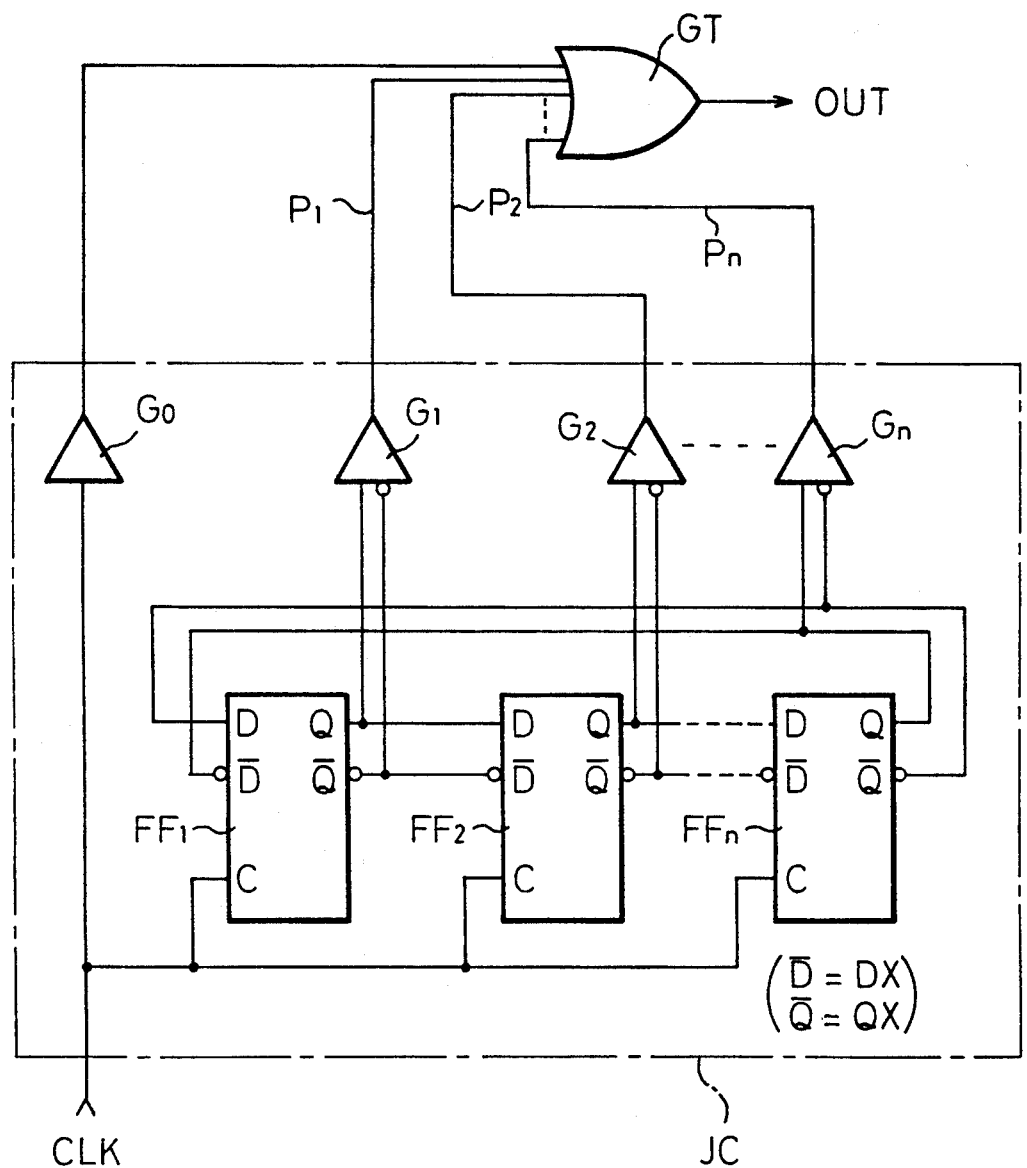
FIG. 17 is a circuit diagram showing a fundamental constitution of the counter circuit according to a seventh aspect of the present invention.

FIG. 17 illustrates a fundamental constitution of the counter circuit according to a seventh aspect of the present invention.

The illustrated circuit includes a Johnson-type counter JC including a plurality of flip-flops FF$_1$~FFn connected in a cascade connection, each flip-flop simultaneously receiving a clock signal CLK at a respective clock input end C, and a gate unit GT for generating a logic sum of the clock signal and signals at output ends Qr and QX. of the flip-flops in the counter. The Johnson-type counter includes a buffer unit G$_0$, G$_1$~Gn for regulating respective timings at which the clock signal and the signals at the respective output ends of each flip-flop are input to the gate unit, GT non-inverting and inverting outputs of a last stage flip-flop FFn being input to data inverting and data non-inverting input ends of a first stage flip-flop FF$_1$, respectively, and operation amplitude levels of respective differential signal outputs of the flip-flops being set to be smaller than those of other circuits.

According to the first aspect (FIG. 11) and the third aspect (FIG. 13) of the present invention, the ratio of frequency division is expressed as follows:

$$1/\{2\cdot(N_1)\} \times 1/\{2\cdot(N_2)\} \times 1/\{2\cdot(N_3)\} \times \ldots \ldots \ldots \times 1/\{2\cdot(Nm)\} \quad (1)$$

Note, reference Nm denotes the number of flip-flops in the m-th stage counter JCm (JCCm), where m indicates an integer equal to or greater than two (m≧2). As is obvious from the formula (1), it is possible to arbitrarily set the division ratio by suitably selecting the number N$_1$, N$_2$, ..., Nm of flip-flops in the respective stage counters.

An example of selection of the division ratio is shown in Table below.

TABLE

| DIV. RATIO | N$_1$ | N$_2$ | N$_3$ | N$_4$ |
|---|---|---|---|---|
| ½ | 1 | | | |
| ¼ | 2 | | | |
| 1/6 | 3 | | | |
| ⅛ | 2 | 1 | | |
| : | | | | |
| 1/16 | 2 | 2 | | |
| : | | | | |
| 1/24 | 3 | 2 | | |
| : | | | | |
| 1/32 | 2 | 2 | 1 | |
| : | | | | |
| 1/64 | 2 | 2 | 2 | |
| : | | | | |
| 1/128 | 2 | 2 | 2 | 1 |
| : | | | | |
| 1/256 | 2 | 2 | 2 | 2 |

Also, according to the second aspect (FIG. 12) and the fourth aspect (FIG. 14) of the present invention, it is possible to output a clock signal (pulse) one time in one period or cycle of an output signal having the division ratio expressed by the formula (1).

Also, according to the fifth aspect (FIG. 15) and the sixth aspect (FIG. 16) of the present invention, it is possible to obtain the effects dependent on the second aspect or the fourth aspect.

Furthermore, according to the seventh aspect (FIG. 17) of the present invention, since the operation amplitude level of respective differential signal outputs of the flip-flops FF$_1$ to FFn constituting the Johnson-type counter JC is set to be smaller than that of other circuits, it is possible to quickly change a level of the output of each flip-flop, from "L" level to "H" level, or from "H" level to "L" level. Namely, it is possible to reduce the operation delay time of each flip-flop and thus heighten a maximum operation frequency of the Johnson-type counter JC. This contributes to a high speed operation of the entire counter circuit.

With the configuration of FIG. 17 buffer gates G$_0$ and G$_1$~Gn are provided for regulating respective times at which the clock signal CLK and the signals at the respective output ends of each flip-flop are input to the gate means (OR gate GT). Each buffer gate G$_1$, G$_2$, ..., Gn receives a differential signal of small amplitude from the corresponding flip-flop, and amplifies the differential signal up to an amplitude level which is necessary and sufficient for the logic operation in the OR gate GT. On the other hand, the buffer gate G$_0$ functions as a gate for phase regulation.

The operation of the counter circuit of FIG. 17 will now be explained with reference to the timing chart of FIG. 18.

Figure 18:
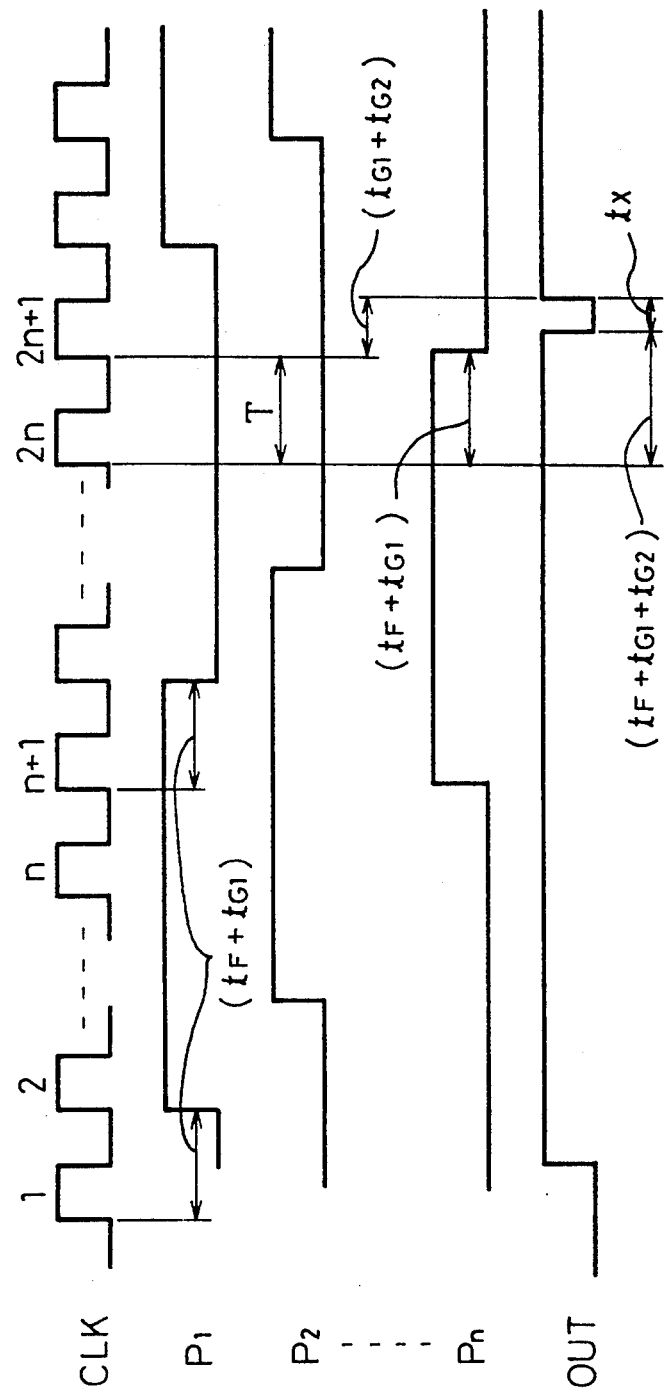
FIG. 18 is a timing chart representing the operation of the circuit of FIG. 17.

In FIG. 18, reference T denotes a period of the clock signal CLK; reference t$_F$ represents an operation delay time of the flip-flop of one stage; reference t$_{G1}$ represents an operation delay time of each buffer gate G$_0$~Gn; and reference t$_{G2}$ represents an operation delay time of the OR gate GT.

First, it is assumed that respective non-inverting outputs "Q" (inverting outputs "QX") of each flip-flop FF$_1$ to FFn are all in "L" level ("H" level) in the initial state. In this state, when the first clock signal CLK(1) is applied, the non-inverting output Q of the first stage flip-flop $FF_1$ is made "H" level by the inverting output QX of the last stage flip-flop FFn. The change of the level is transmitted through the buffer gate $G_1$. Accordingly, the time at which the output $P_1$ of the gate $G_1$ is made "H" level is after a lapse of the delay time of $(t_F+t_{G1})$ from the rise edge of the input clock signal CLK. In the like manner, when the non-inverting output Q of the flip-flop $FF_1$ is made "L" level, the output $P_1$ of the gate $G_1$ is made "L" level after a lapse of the delay time of $(t_f+t_{G1})$ from the rise edge of the (n−1)-th clock signal CLK(n+1).

At the point of time of the application of the first clock signal CLK(1), respective non-inverting outputs Q of other flip-flops $FF_2$ to FFn still remain "L" level. At the point of time after the application of the first clock signal CLK(1), however, the non-inverting output Q of the second stage flip-flop $FF_2$ is made "H" level upon receipt of the second clock signal CLK(2). Hereinafter in the like manner, the non-inverting output Q of the last stage flip-flop FFn remains "L" level until the application of the (n−1)-th clock signal CLK(n−1) and, when the n-th clock signal CLK(n) is applied, the output Q of the flip-flop FFn is made "H" level after a lapse of the delay time of $(t_F+t_{G1})$. Also, when the 2n-th clock signal CLK(2n) is applied, the output Q of the flip-flop FFn is made "L" level after a lapse of the delay time of $(t_F+t_{G1})$. As a result, the outputs Q of each flip-flop $FF_1$ to FFn are all brought to "L" level (initial state).

Thus, the outputs Q of all of the flip-flops are brought to "L" level every time the clock signal CLK is input 2n times. At this time, the edge of the clock signal CLK passing through the buffer gate $G_0$ becomes effective, and therefore, the OR gate GT outputs a pulse as shown by reference $t_X$ in FIG. 18.

In this case, as a condition based on which the OR gate GT can output a pulse having rise and fall edges, it is necessary for the pulse width $t_X$ to have a margin. To this end, it is necessary to make the fall time of the output of the OR gate GT (i.e., the fall time of the input signal thereof) quicker. The fall time is determined by a condition ① after a lapse of the operation delay time $t_{G1}$ of the buffer gate $G_0$ from the fall edge of the clock signal CLK passing through the gate $G_0$, or a condition ② after a lapse of the operation delay times $t_F$ and $T_{G1}$ of the flip-flop FFn and the buffer gate Gn from the rise edge of the clock signal CLK. With an increase in the frequency of the clock signal CLK, however, the fall edge of the output of the OR gate GT is determined by the condition ②. The pulse width $t_X$ of the output of the OR gate GT is expressed as follows:

$$tx = (T + t_{G1} + t_{G2}) - (t_F + t_{G1} + t_{G2}) \quad (2)$$
$$= T - t_F$$

Assuming that the operation delay time, $t_F$ of the flip-flop is a specific value, the shorter the period T of the clock signal CLK becomes, the less the margin of the pulse width $t_X$ becomes. Where the time $t_X$ has little margin, a problem occurs in that the edge of the clock signal CLK becomes ineffective and thus it becomes impossible to output a desired pulse signal at the output of the OR gate GT.

From the above, it is appreciated that it is possible to give a sufficient margin to the pulse width $t_X$ by reducing the operation delay time $t_F$ of each flip-flop $FF_1$ to FFn. Even if the frequency of the clock signal CLK is increased, the output of the OR gate GT can be output without error. To reduce the operation delay time of each flip-flop, the operation amplitude level of the differential signal output of each flip-flop is selected to be smaller than that of other circuits. By the feature, it is possible to increase the operation speed of each flip-flop and thus heighten the maximum operation frequency of the counter.

Next, the preferred embodiments of the present invention will be explained with reference to FIGS. 19 to 36.

Figure 19:
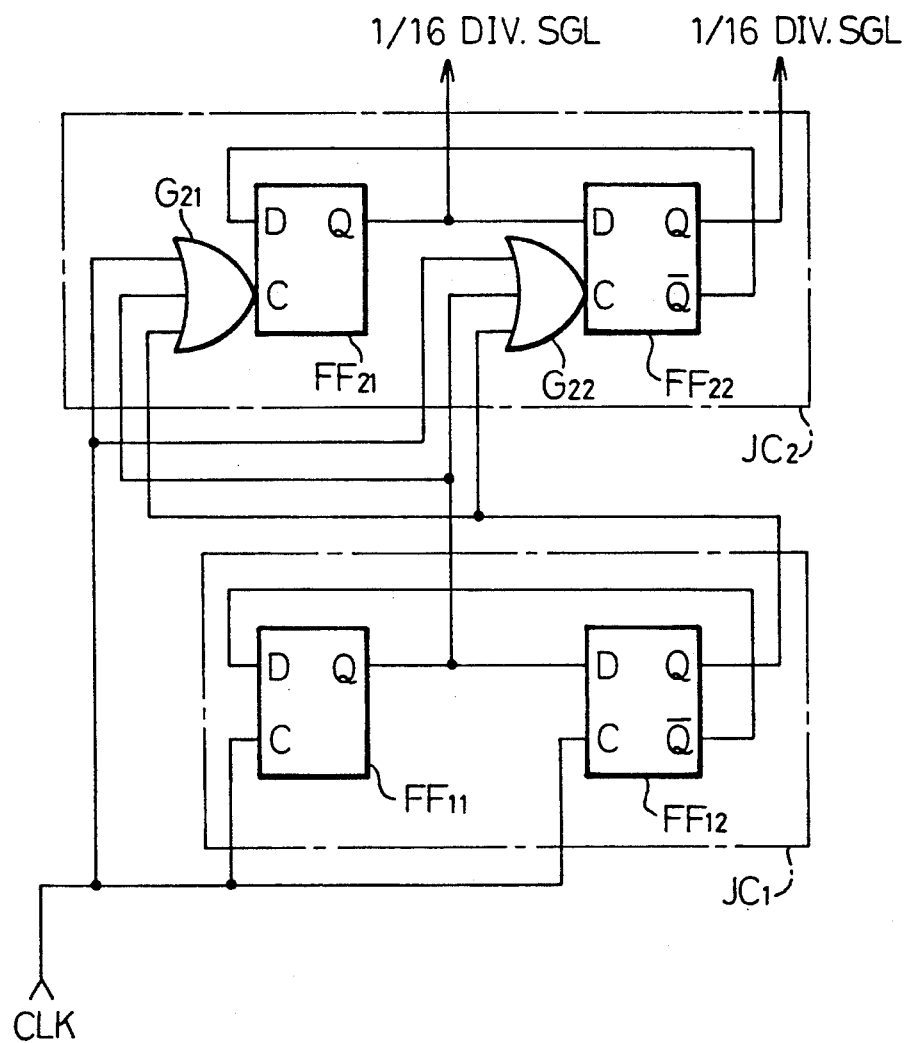
FIG. 19 is a circuit diagram showing a constitution of the 1/16 frequency-dividing circuit according to an embodiment corresponding to the first aspect of the present invention.
Figure 20:
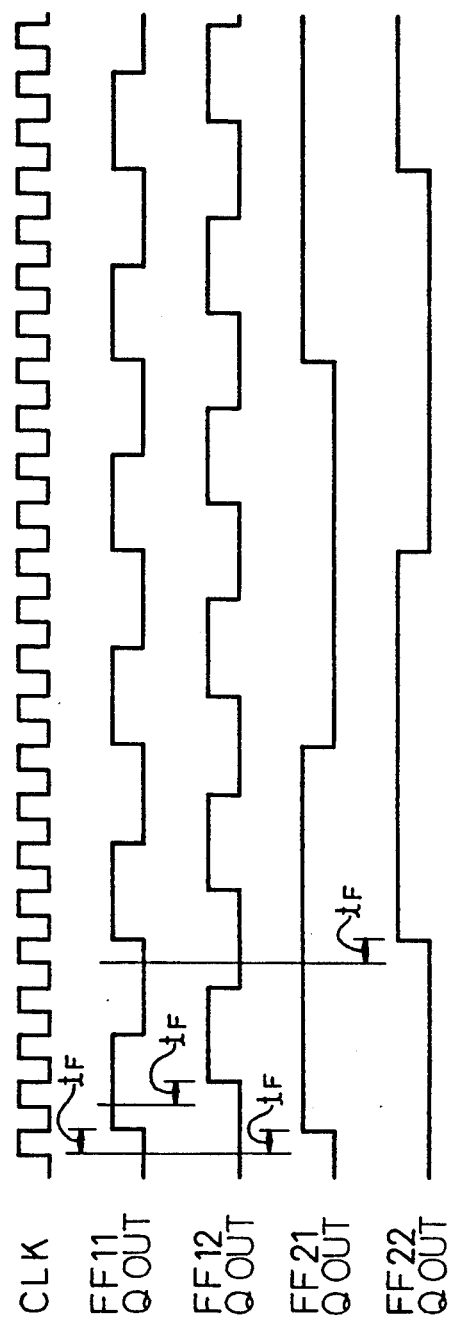
FIG. 20 is a timing chart representing the operation of the circuit of FIG. 19.

FIG. 19 illustrates a constitution of the 1/16 frequency-dividing circuit according to an embodiment corresponding to the first aspect of the present invention, and FIG. 20 shows a timing chart representing the operation thereof.

The circuit of FIG. 19 includes Johnson-type counters $JC_1$ and $JC_2$ of two stages. There are two flip-flops ($FF_{112}$ $FF_{12}$) in the first stage. counter $JC_1$ and two flip-flops ($FF_{21}$, $FF_{22}$) in the second stage counter $JC_2$. This corresponds to $N_1=N_2=2$ in the aforementioned Table. Signals at respective output ends Q of the flip-flops $FF_{11}$, $FF_{12}$ in the first stage counter $JC_1$ are input via OR gates $G_{21}$ and $G_{22}$ in the second stage counter $JC_2$ to respective clock input ends C of the flip-flops $FF_{21}$, $FF_{22}$ in the counter $JC_2$. Also, a clock signal CLK is input to the respective clock input ends C of the flip-flops $FF_{11}$, $FF_{12}$ in the first stage counter $JC_1$, and input via the OR gates $G_{21}$, $G_{22}$ in the second stage counter $JC_2$ to the respective clock input ends C of the flip-flops $FF_{21}$, $FF_{22}$. Finally, the flip-flops $FF_{21}$, $FF_{22}$ in the second stage counter $JC_2$ output a 1/16 divided signal from the respective output ends Q.

In FIG. 20, reference $t_F$ denotes an operation delay time of the flip-flop of one stage.

According to the constitution of the present embodiment, as shown in the timing chart of FIG. 20, time from the application of the clock signal CLK until the 1/6 divided signal is obtained is no more than $t_F$, corresponding to the operation delay time of the flip-flop of one stage ($FF_{11}$ or $FF_{12}$). Contrary to this, according to the prior art (see FIGS. 1 and 2), the 1/16 divided signal cannot be obtained until the clock signal CLK is applied to the first stage flip-flop FF1 and then passed through the flip-flops of four stages (FF1 to FF4). Namely, it is possible to reduce the whole operation delay time required for obtaining the 1/16 divided signal, while using flip-flops of the same number (i.e., four) as that in the prior art (see FIG. 1). This contributes to a high speed operation of the entire circuit.

Also, since the number of flip-flops used for obtaining the 1/16 divided signal is no more than four, it is possible to relatively simplify the circuit constitution, as compared with the prior art.

Figure 21:
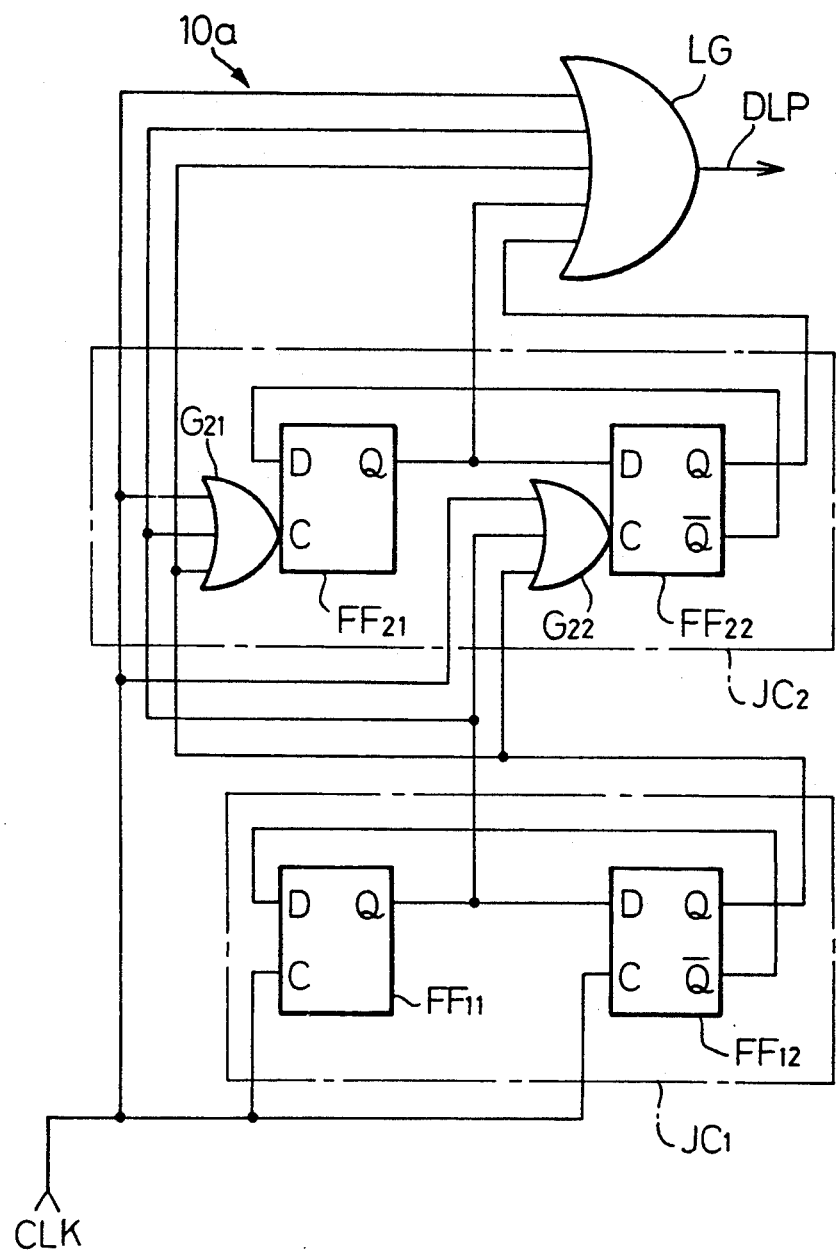
FIG. 21 is a circuit diagram showing a constitution of the divided signal generating circuit according to an embodiment corresponding to the second aspect of the present invention.
Figure 22:
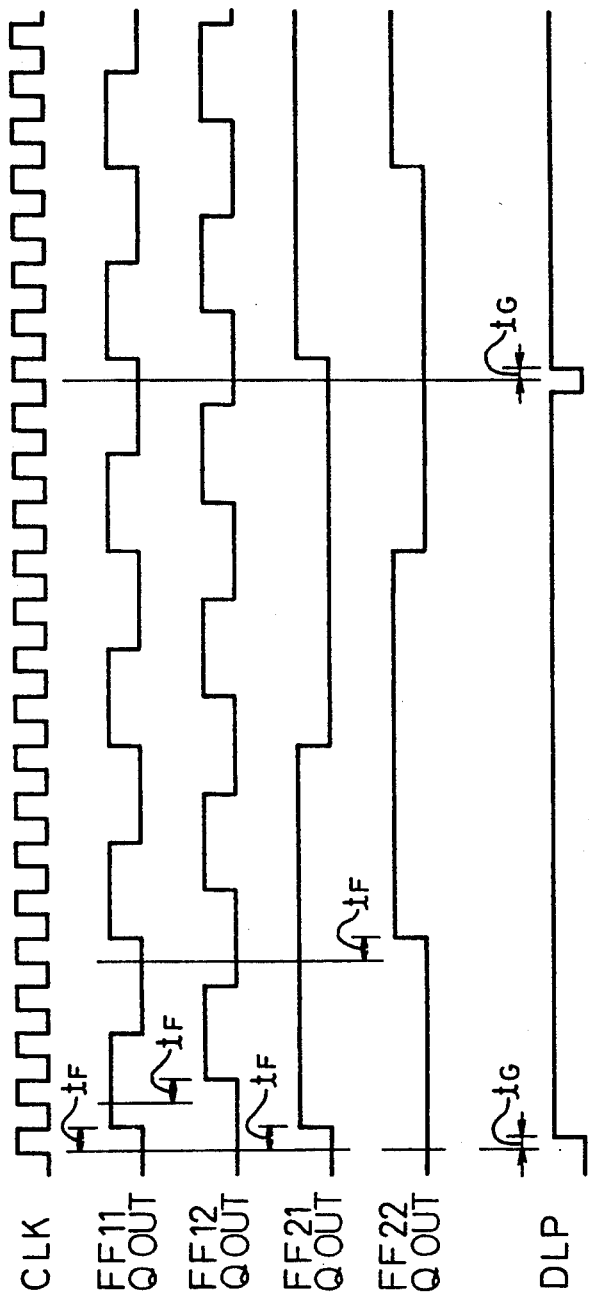
FIG. 22 is a timing chart representing the operation of the circuit of FIG. 21.

FIG. 21 illustrates a constitution of the divided signal generating circuit according to an embodiment corresponding to the second aspect of the present invention, and FIG. 22 shows a timing chart representing the operation thereof.

The divided signal generating circuit 10a of the present embodiment utilizes the output of the 1/16 frequency-dividing circuit of FIG. 19. Namely, the circuit 10a includes an OR gate LG which generates a logic sum of the clock signal CLK and the signals at the respective output ends Q of all, of the flip-flops $FF_{11}$, $FF_{12}$, $FF_{21}$ and $FF_{22}$ and, as a result thereof outputs a data load pulse signal DLP.

In FIG. 22, reference $t_F$ denotes the operation delay time of the flip-flop of one stage, and reference $t_G$ denotes an operation delay time of the gate of one stage.

According to the constitution of the present embodiment, as shown in the timing chart of FIG. 22, it is possible to output a clock signal (data load pulse DLP) one time in one period or cycle of the 1/16 divided signal obtained from the 1/16 frequency-dividing circuit of FIG. 19.

Figure 23:
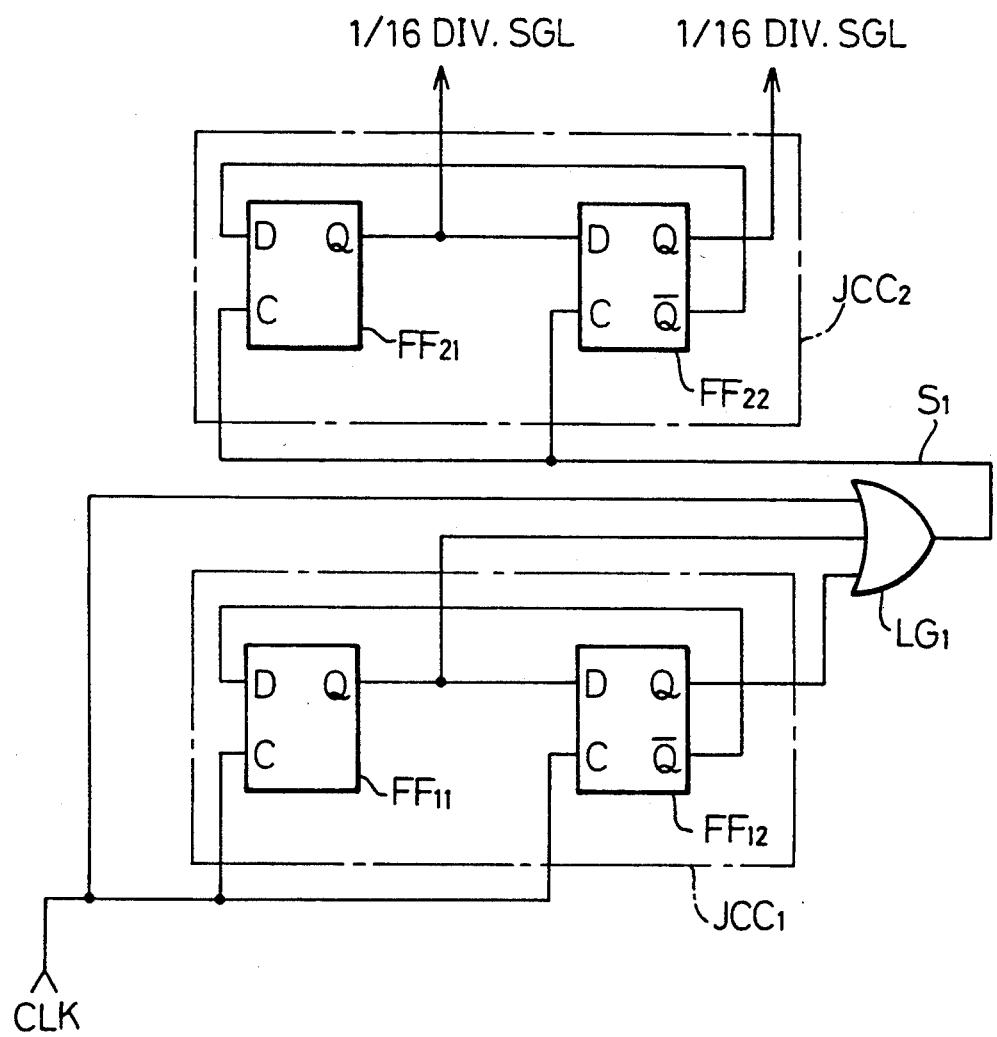
FIG. 23 is a circuit diagram showing a constitution of the 1/16 frequency-dividing circuit according to an embodiment corresponding to the third aspect of the present invention.
Figure 24:
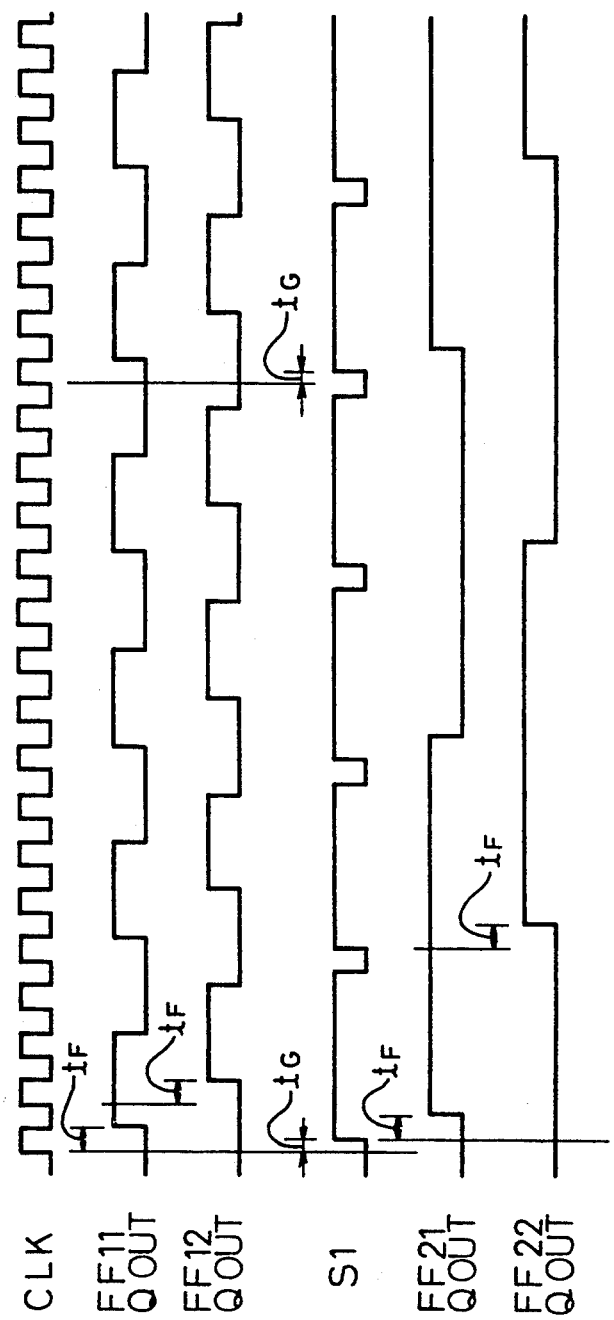
FIG. 24 is a timing chart representing the operation of the circuit of FIG. 23.

FIG. 23 illustrates a constitution of the 1/16 frequency-dividing circuit according to an embodiment corresponding to the third aspect of the present invention, and FIG. 24 shows a timing chart representing the operation thereof.

The circuit of FIG. 23 includes Johnson-type counters $JCC_1$ and $JCC_2$ of two stages and an OR gate $LG_1$ connected between each counter. The number of flip-flops in the first stage counter $JCC_1$ is two ($FF_{11}$, $FF_{12}$), and the number of flip-flops in the second stage counter $JCC_2$ is also two ($FF_{21}$, $FF_{22}$). Signals at respective output ends Q of the flip-flops $FF_{11}$, $FF_{12}$ in the first stage counter $JCC_1$ are input to the OR gate $LG_1$. Also, a clock signal CLK is input to the OR gate $LG_1$ and respective clock input ends C of the flip-flops $FF_{11}$, $FF_{12}$, in the first stage counter $JCC_1$. Also, an output of the OR gate $LG_1$ (first signal $S_1$) is input to respective clock input ends C of the flip-flops $FF_{21}$, $FF_{22}$ in the second stage counter $JCC_{22}$. Finally, the flip-flops $FF_{21}$, $FF_{22}$ in the second stage counter $JCC_2$ output a 1/16 divided signal from the respective output ends Q.

In FIG. 24, reference $t_F$ denotes the operation delay time of the flip-flop of one stage, and reference $t_G$ denotes the operation delay time of the gate of one stage.

According to the constitution of the present embodiment, as shown in the timing chart of FIG. 24, elapsed time from the application of the clock signal CLK until the 1/16 divided signal is obtained is no more than ($t_F+t_G$), corresponding to the operation delay times of the flip-flop of one stage and the gate of one stage ($LG_1$). Contrary to this, according to the prior art (see FIGS. 1 and 2), the 1/16 divided signal cannot be obtained until the clock signal CLK is passed through the flip-flops of four stages. Namely, it is possible to relatively reduce the whole operation delay time required for obtaining the 1/16 divided signal, while using flip-flops of the same number (i.e., four) as that in the prior art (see FIG. 1).

Also, since the 1/16 divided signal can be obtained using no more than four flip-flops and one logic gate, it is possible to relatively simplify the circuit constitution, as compared with the prior art.

Figure 25:
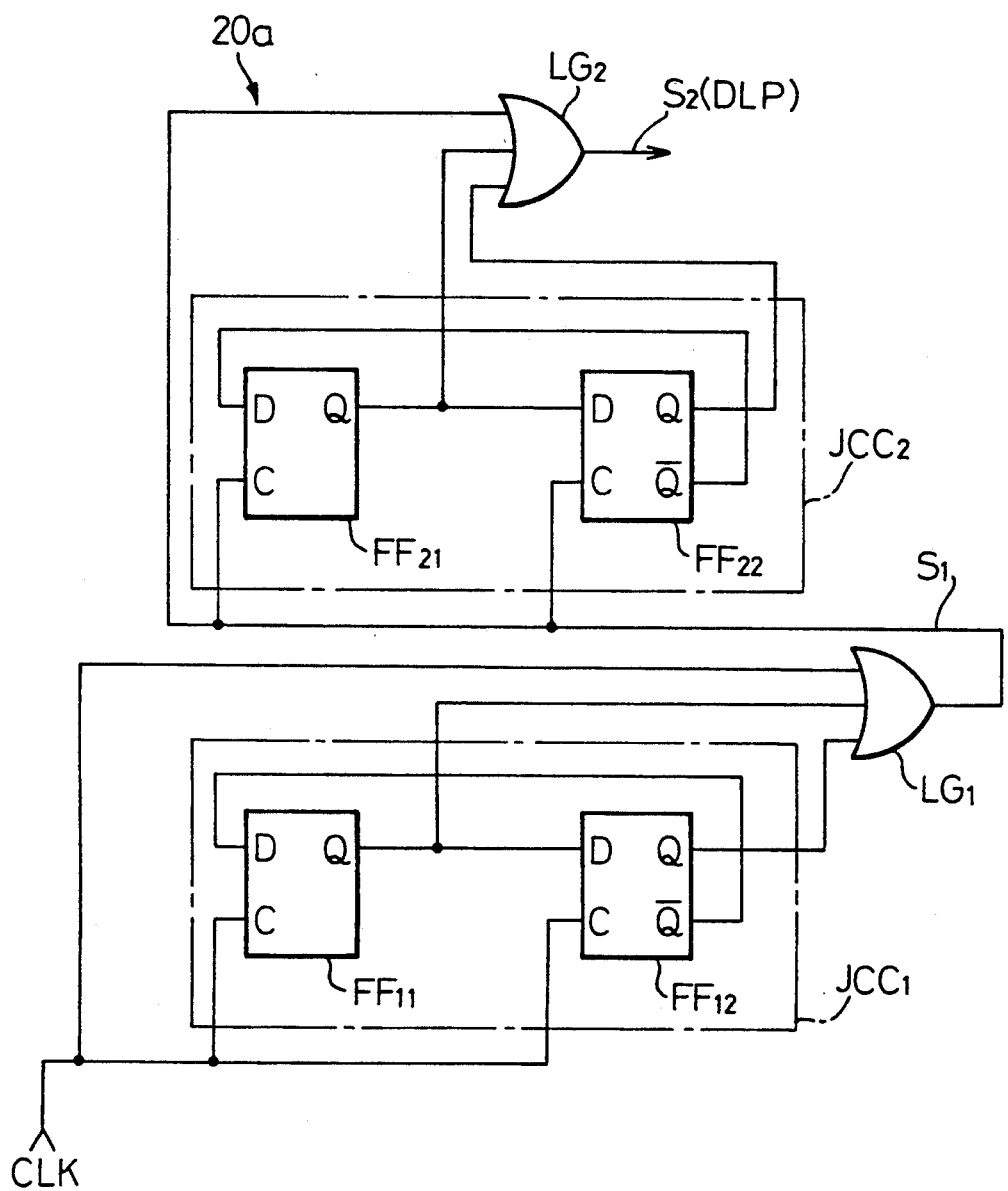
FIG. 25 is a circuit diagram showing a constitution of the divided signal generating circuit according to an embodiment corresponding to the fourth aspect of the present invention.
Figure 26:
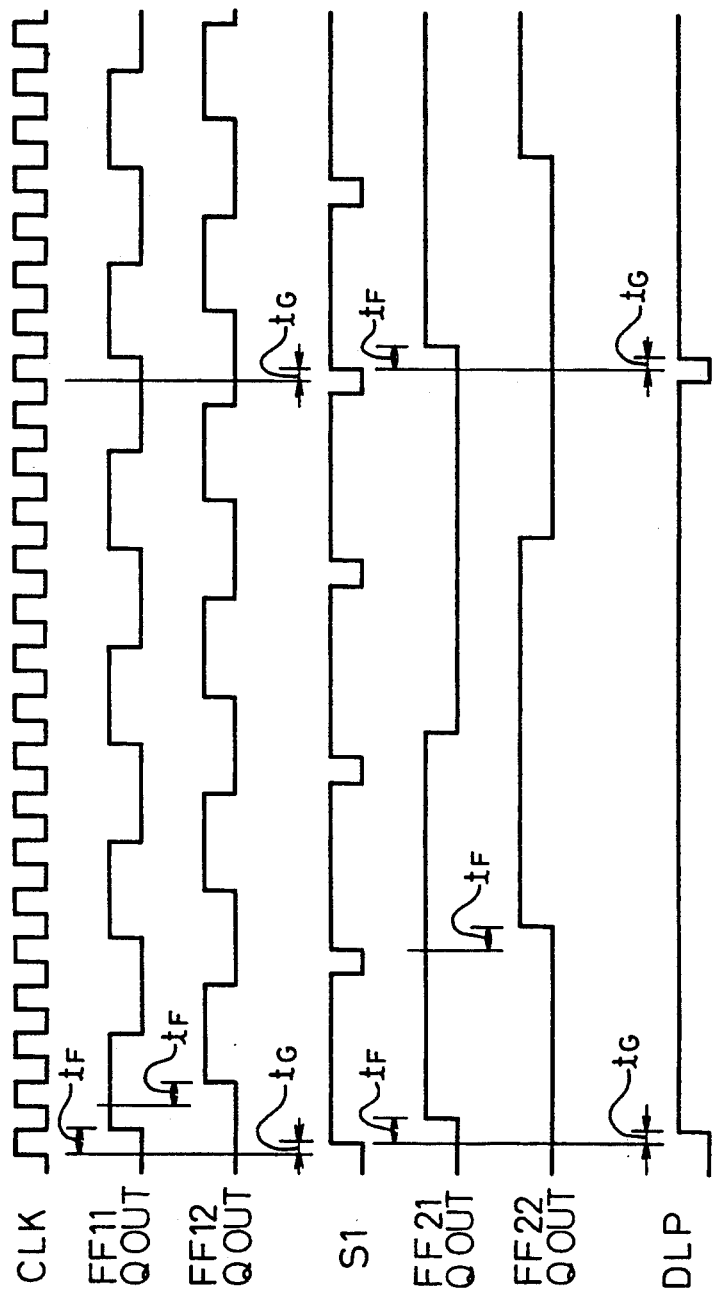
FIG. 26 is a timing chart representing the operation of the circuit of FIG. 25.

FIG. 25 illustrates a constitution of the divided signal generating circuit according to an embodiment corresponding to the fourth aspect of the present invention, and FIG. 26 shows a timing chart representing the operation thereof.

The divided signal generating circuit 20a of the present embodiment utilizes the output of the 1/16 frequency-dividing circuit of FIG. 23. Namely, the circuit 20a includes an OR gate $LG_2$ which generates a logic sum of the first signal $S_1$ (output of the OR gate $LG_1$) and the signals at the respective output ends Q of the flip-flops $FF_{21}$, $FF_{22}$, in the second stage counter $JCC_2$ and, as a result thereof, outputs a second signal $S_2$ (data load pulse DLP).

In FIG. 26, reference $t_F$ denotes the operation delay time of the flip-flop of one stage, and reference $t_G$ denotes the operation delay time of the gate of one stage.

According to the constitution of the present embodiment, as shown in the timing chart of FIG. 26, it is possible to output a clock signal (data load pulse DLP) one time in one period or cycle of the 1/16 divided signal obtained from the 1/16 frequency-dividing circuit of FIG. 23.

Figure 27:
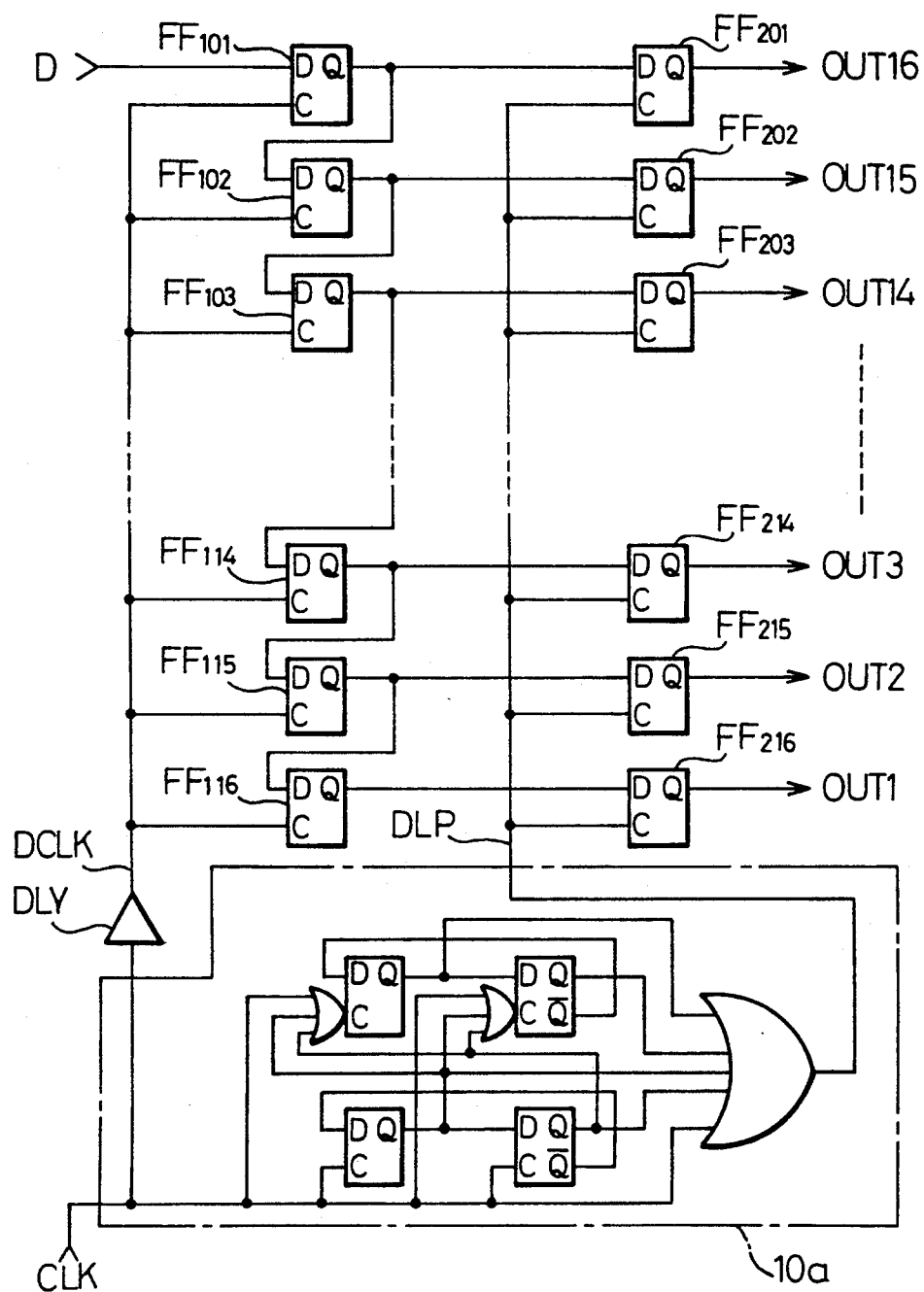
FIG. 27 is a circuit diagram showing a constitution of the 16-bit data demultiplexer circuit according to an embodiment corresponding to the fifth aspect of the present invention.
Figure 28:
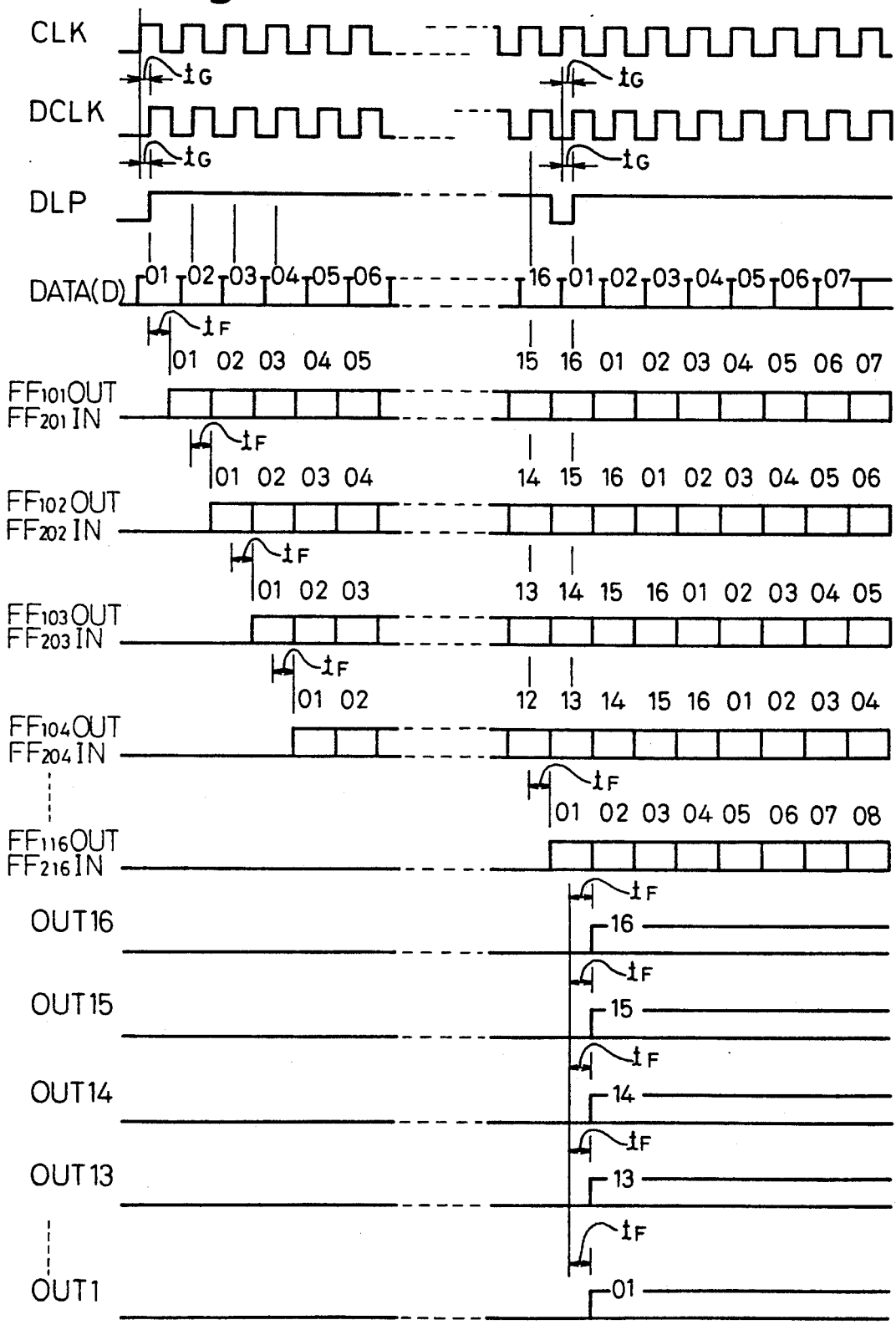
FIG. 28 is a timing chart representing the operation of the circuit of FIG. 27.

FIG. 27 illustrates a constitution of the 16-bit data demultiplexer circuit according to an embodiment corresponding to the fifth aspect of the present invention, and FIG. 28 shows a timing chart representing the operation thereof.

The circuit constitution of FIG. 27 is different from that of FIG. 7 (prior art) in that the divided signal generating circuit 10a (see FIG. 21) is provided in place of the prior art divided signal generating circuit 10b (see FIG. 5). Other elements of the constitution are the same as that of FIG. 7 and thus the explanation thereof is omitted. The circuit of the present embodiment can produce effects dependent on the embodiments of FIGS. 19 and 21.

Figure 29:
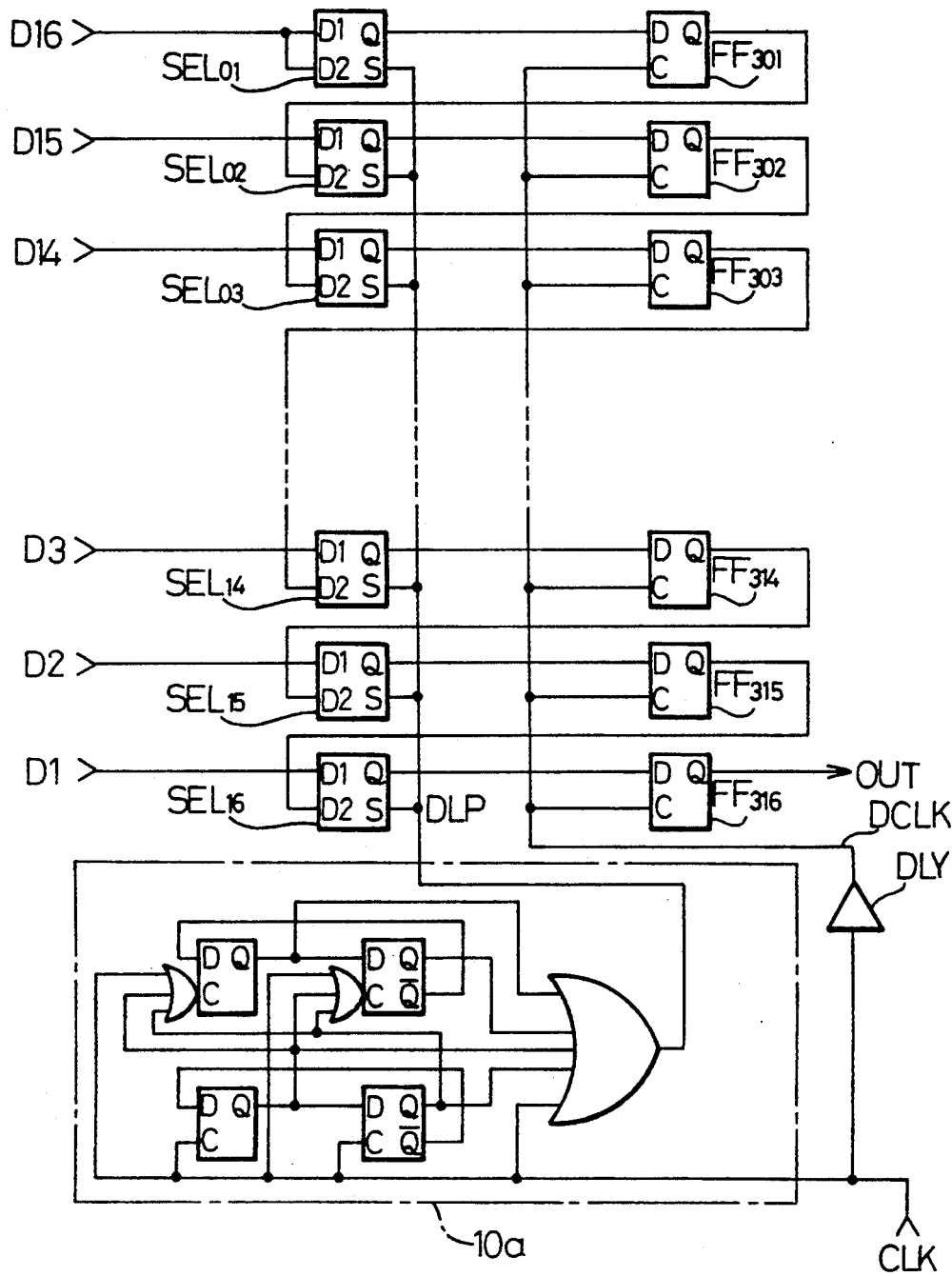
FIG. 29 is a circuit diagram showing a constitution of the 16-bit data multiplexer circuit according to an embodiment corresponding to the sixth aspect of the present invention.
Figure 30:
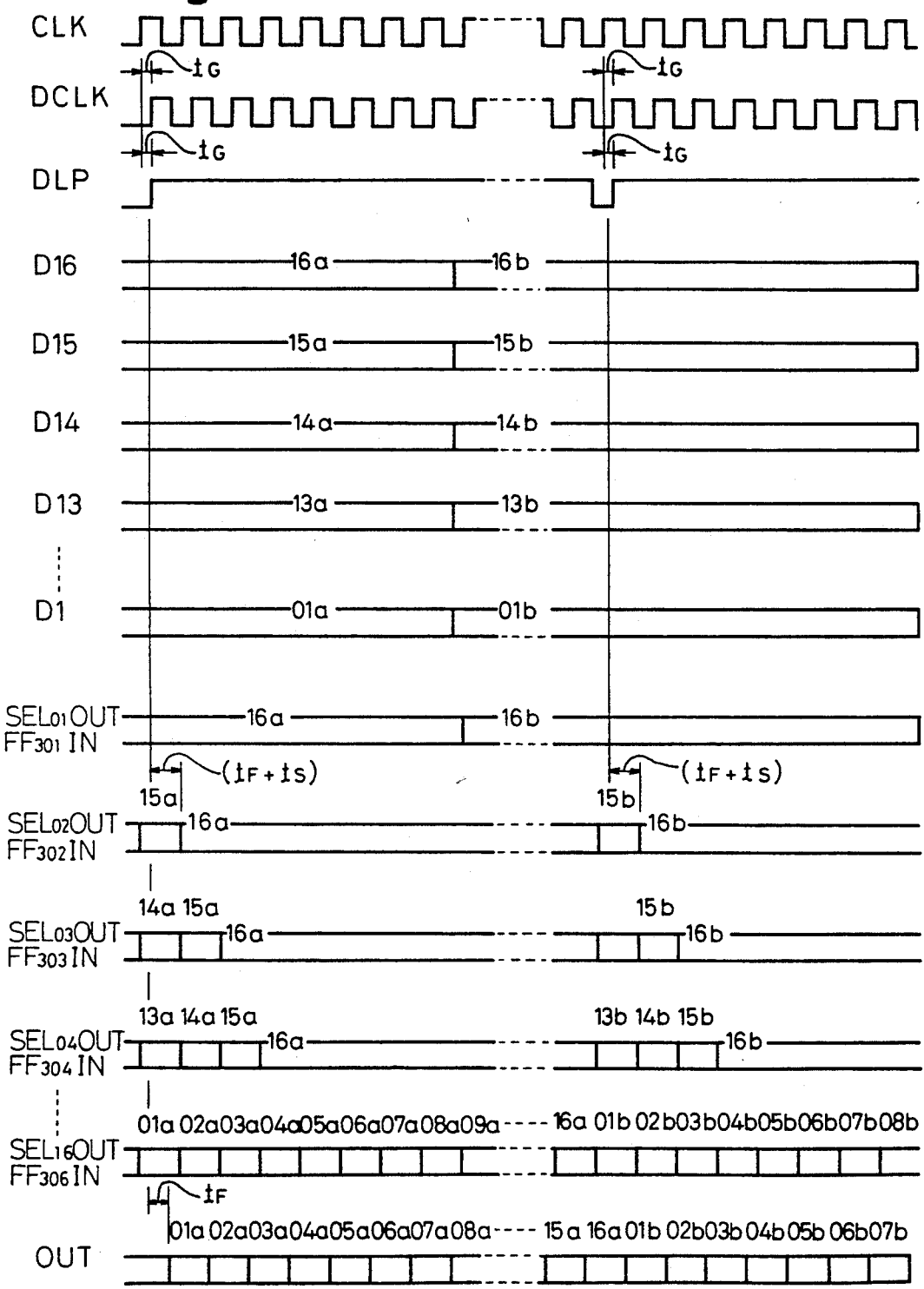
FIG. 30 is a timing chart representing the operation of the circuit of FIG. 29.

FIG. 29 illustrates a constitution of the 16-bit data multiplexer circuit according to an embodiment corresponding to the sixth aspect of the present invention, and FIG. 30 shows a timing chart representing the operation thereof.

The circuit constitution of FIG. 29 is different from that of FIG. 9 (prior art) in that the divided signal generating circuit 10a (see FIG. 21) is provided in place of the prior art divided signal, generating circuit 10b (see FIG. 5). Other elements of the constitution are the same as that of FIG. 9 and thus the explanation thereof is omitted. In this embodiment as well, it is possible to obtain effects dependent on the embodiments of FIGS. 19 and 21.

Although, in each embodiment, the 1/16 divided signal is obtained using the Johnson-type counters $JC_1$, $JC_2$ ($JCC_1$, $JCC_2$) of two stages each having two flip-flops, the ratio of frequency division is not restrictive to 1/16. As is obvious from the gist of the present invention, it is possible to arbitrarily select the division ratio by suitably selecting the number of stages of the Johnson-type counter or the number of flip-flops in each counter.

Figure 31:
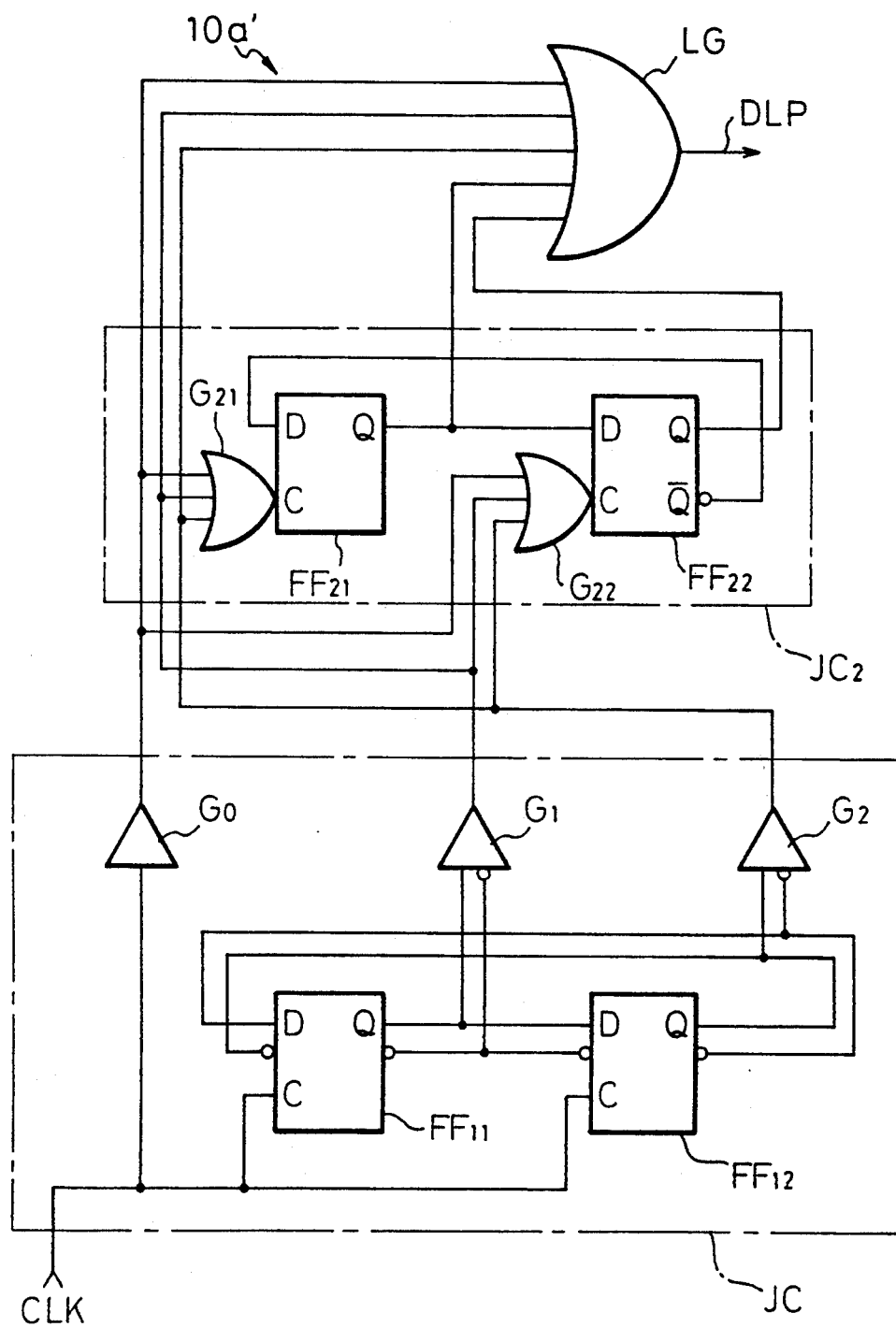
FIG. 31 is a circuit diagram showing a constitution of the divided signal generating circuit according to an embodiment corresponding to the seventh aspect of the present invention.
Figure 32:
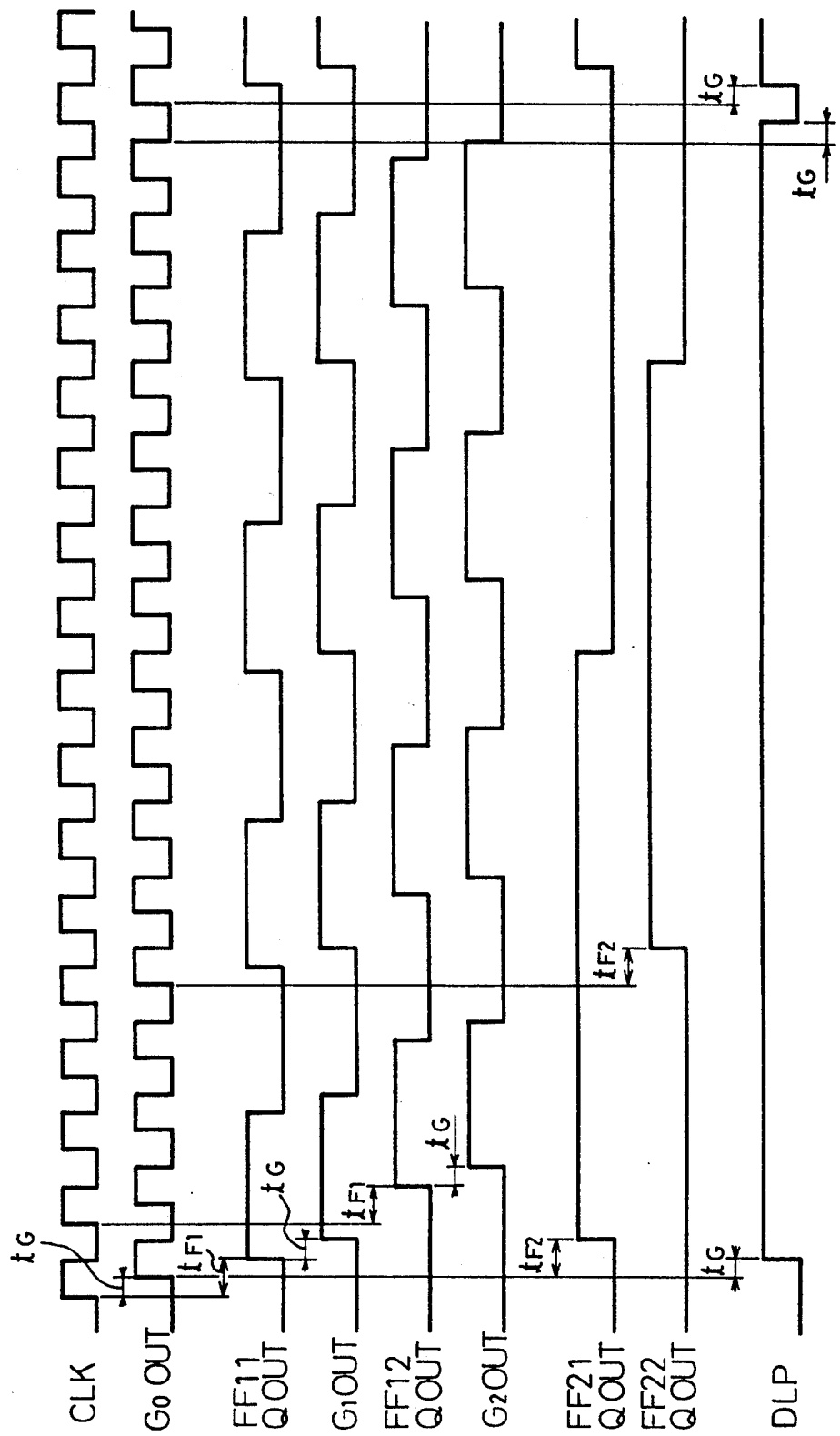
FIG. 32 is a timing chart representing the operation of the circuit of FIG. 31.

FIG. 31 illustrates a constitution of the divided signal generating circuit according to an embodiment corresponding to the seventh aspect of the present invention, and FIG. 32 shows a timing chart representing the operation thereof.

The divided signal generating circuit $10a'$ of the present embodiment is different from the divided signal generating circuit 10a shown in FIG. 21 in that the Johnson-type counter JC (see FIG. 17) is provided in place of the Johnson-type counter $JC_1$. Other elements of the constitution are the same as that of FIG. 21 and thus the explanation thereof is omitted.

According to the present embodiment, it is possible to increase the operation speed of each flip-flop $FF_{11}$, $FF_{12}$ in the first stage counter JC, as explained in connection with FIGS. 17 and 18. As a result, it is possible to reduce the operation delay time of each flip-flop $FF_{11}$, $FF_{12}$, and thus heighten a maximum operation frequency of the Johnson-type counter JC. This contributes to a high speed operation of the entire circuit.

In FIG. 32, reference $t_G$ denotes an operation delay time of each gate of one stage, reference $t_{F1}$ denotes an operation delay time of each flip-flop of one stage in the first stage counter JC, and reference $t_{F2}$ denotes an operation delay time of each flip-flop of one stage in the second stage counter JC$_2$. The operation of the present circuit is easily deduced from the explanation described in connection with FIG. 18 and thus the explanation thereof is omitted.

Figure 33:
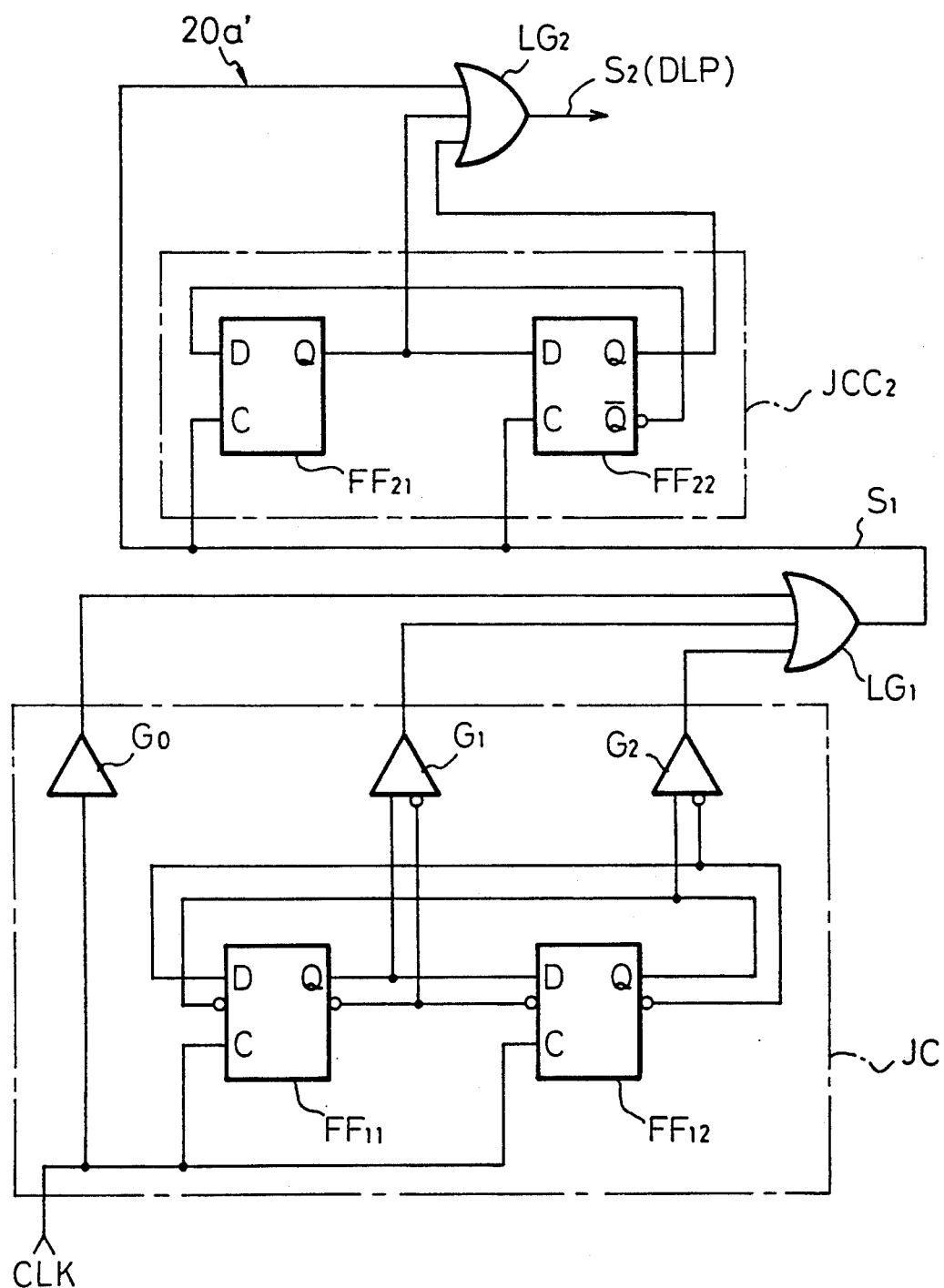
FIG. 33 is a circuit diagram showing a constitution of the divided signal generating circuit according to another embodiment corresponding to the seventh aspect of the present invention.
Figure 34:
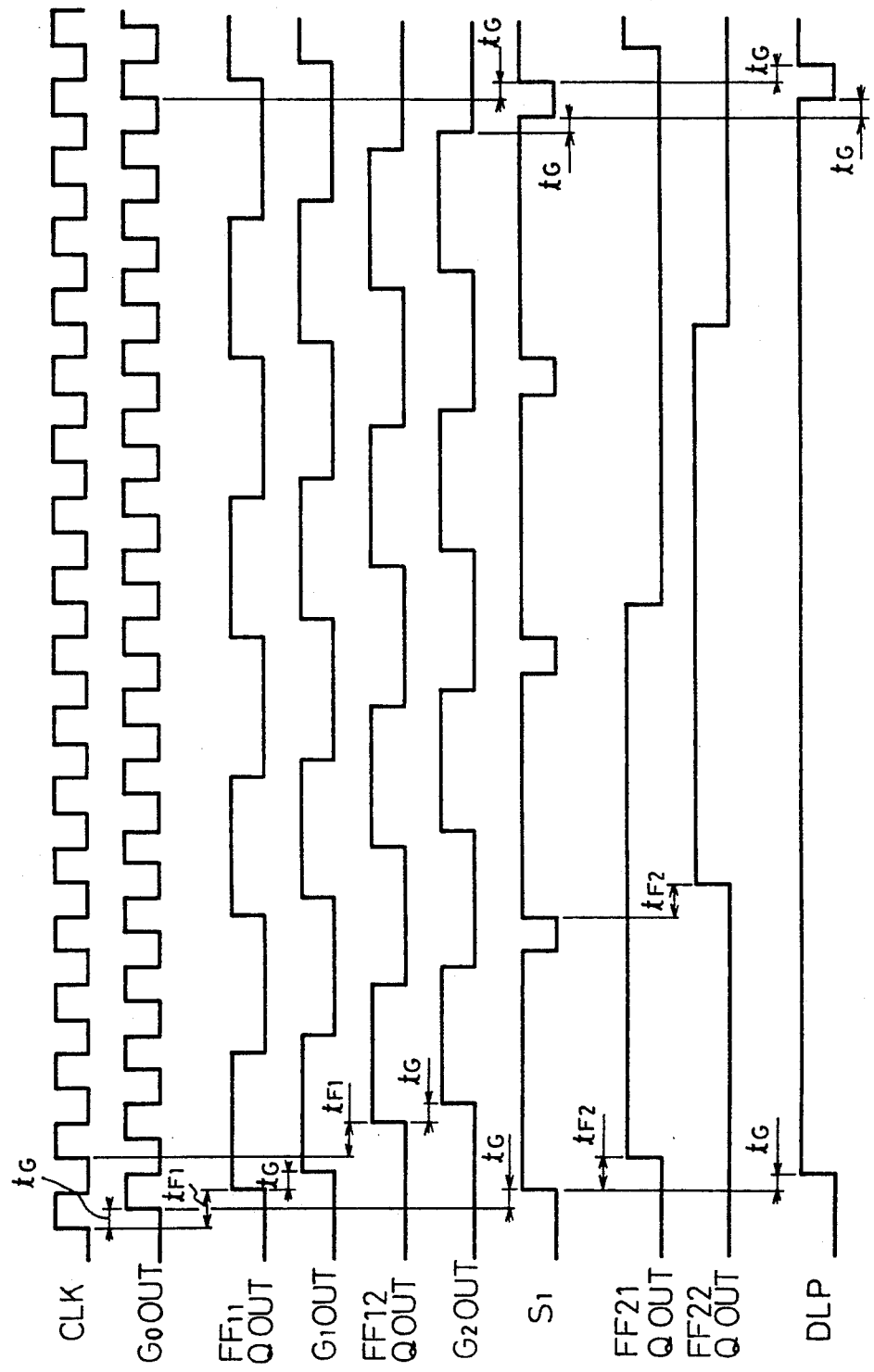
FIG. 34 is a timing chart representing the operation of the circuit of FIG. 33.

FIG. 33 illustrates a constitution of the divided signal generating circuit according to another embodiment corresponding to the seventh aspect of the present invention, and FIG. 34 shows a timing chart representing the operation thereof.

The divided signal generating circuit 20a' of the present embodiment is different from the divided signal generating circuit 20a shown in FIG. 25 in that the Johnson-type counter JC (see FIG. 17) is provided in place of the Johnson-type counter JCC$_1$. Other constitution is the same as that of FIG. 25 and the operation and effects of the entire circuit are easily deduced from the explanation described in connection with FIGS. 17 and 18, and thus the explanations thereof are omitted.

Figure 35:
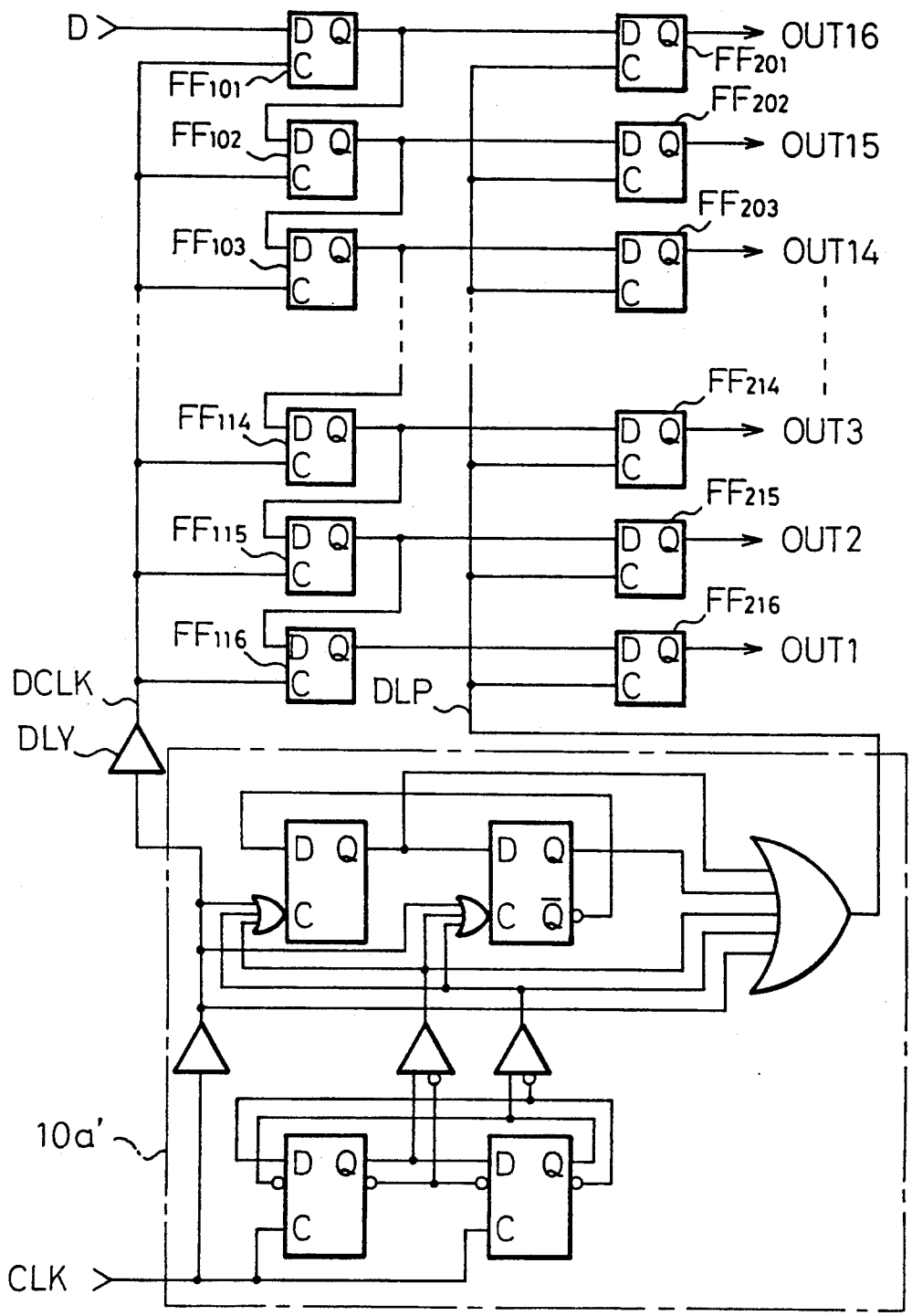
FIG. 35 is a circuit diagram showing a constitution of the 16-bit data demultiplexer circuit as an application example of the circuit of FIG. 31.
Figure 36:
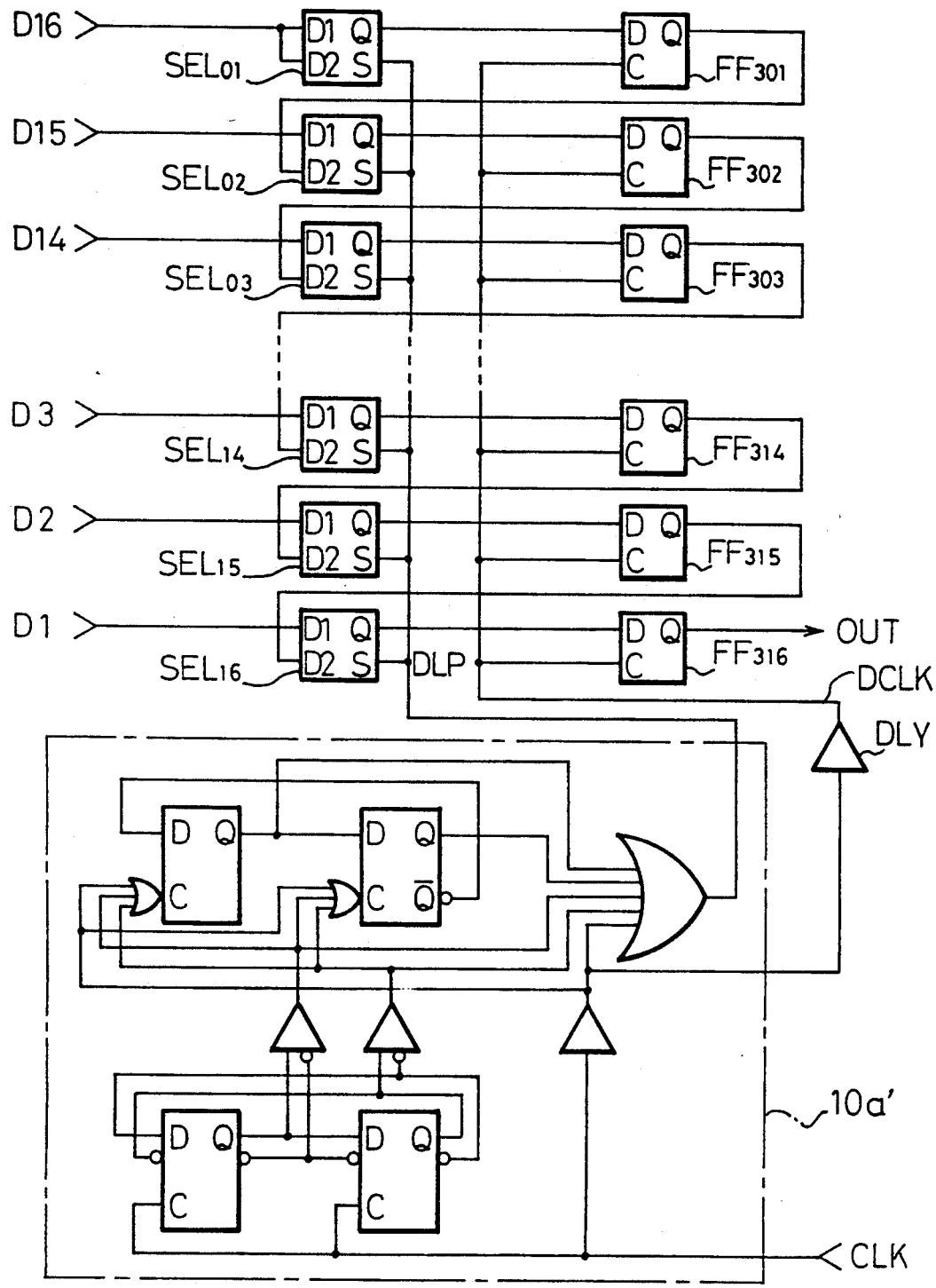
FIG. 36 is a circuit diagram showing a constitution of the 16-bit data multiplexer circuit as another application example of the circuit of FIG. 31.

FIGS. 35 and 36 illustrate constitutions of the 16-bit data demultiplexer circuit and the 16-bit data multiplexer circuit, respectively, as application examples of the divided signal generating circuit 10a' of FIG. 31.

Respective circuits are different from the corresponding circuits shown in FIGS. 27 and 29 in that the divided signal generating circuit 10a' (see FIG. 31) is provided in place of the divided signal generating circuit 10a. Other constitutions are the same as those of FIGS. 27 and 29 and the operation and effects of the entire circuit are easily deduced from the explanation described in connection with FIGS. 17 and 18, and thus the explanations thereof are omitted.

Although the present invention has been disclosed and described by way of a number of embodiments, it is apparent to those skilled in the art that other embodiments and modifications of the present invention are possible without departing from the spirit or essential features thereof.

We claim:

1. A counter circuit comprising:
   Johnson-type counters of m stages, each counter including a plurality of flip-flops connected in a cascade connection, each flip-flop receiving a clock signal at a respective clock input;
   wherein signals at respective outputs of the plurality of flip-flops in a (k−1)-th stage counter are simultaneously input to respective clock inputs of the plurality of flip-flops in each counter of a k-th stage through the m-th stage, where k≦m.

2. A counter circuit as set forth in claim 1, wherein each of the counters of a second stage through the m-th stage comprises a gate means for simultaneously receiving the clock signal and the signals from the respective outputs of the plurality of flip-flops in each counter of the preceding stage or stages.

3. A divided signal generating circuit comprising:
   a counter circuit including Johnson-type counters of m stages, each counter including a plurality of flip-flops connected in a cascade connection, each flip-flop receiving a clock signal at a respective clock input, wherein signals at respective outputs of the plurality of flip-flops in a (k−1)-th stage counter are simultaneously input to respective clock inputs of the plurality of flip-flops in each counter of a k-stage through the m-th stage, wherein k≦m; and
   a logic gate which generates a logic sum of the clock signal and signals at respective outputs of all of the flip-flops in the counter circuit and outputs a result thereof as a m-th signal.

4. A divided signal generating circuit as set forth in claim 3, wherein each counter of a second stage through the m-th stage comprises a gate means for simultaneously receiving the clock signal and the signals from the respective outputs of the plurality of flip-flops in each counter of the preceding stage or stages.

5. A counter circuit comprising:
   Johnson-type counters of m stage, each counter including a plurality of flip-flops connected in a cascade connection; and
   (m−1) logic gates connected between each stage of the Johnson-type counters;
   wherein a clock signal is simultaneously input to respective clock inputs of the plurality of flip-flops in a first stage counter; a logic sum of the clock signal and signals at respective outputs of the plurality of flip-flops in the first stage counter is generated by a first logic gate and output as a first signal; the first signal is simultaneously input to respective clock inputs of the plurality of flip-flops in a second stage counter; a logic sum of the first signal and signals at respective outputs of the plurality of flip-flops in the second stage counter is generated by a second logic gate and output as a second signal; and, hereinafter in the like manner, signals representing logic sums are generated for input to respective clock inputs of the plurality of flip-flops of each additional stage so that a (m−1)-th signal is simultaneously input to respective clock inputs of the plurality of flip-flops in a m-th stage counter.

6. A divided signal generating circuit comprising:
   a counter circuit including Johnson-type counters of m stages, each counter including a plurality of flip-flops connected in a cascade connection, and (m−1) logic gates connected between each stage of the counters, wherein a clock signal is simultaneously input to respective clock inputs of the plurality of flip-flops in a first stage counter; a logic sum of the clock signal and signals at respective outputs of the plurality of flip-flops in the first stage counter is generated by a first logic gate and output as a first signal; the first signal is simultaneously input to respective clock inputs of the plurality of flip-flops in a second stage counter; a logic sum of the first signal and signals at respective outputs of the plurality of flip-flops in the second stage counter is generated by a second logic gate and output as a second signal; and, hereinafter in the like manner, signals representing logic sums are generated for input to respective clock inputs of the plurality of flip-flops of each additional stage so that a (m−1)-th signal is simultaneously input to respective clock inputs of the plurality of flip-flops in a m-th stage counter; and
   a logic gate which generates a logic sum of the (m−1)-th signal and signals at respective outputs of the plurality of flip-flops in the m-th stage counter and outputs a result thereof as a m-th signal.

7. A data converting circuit comprising:
   a divided signal generating circuit including:
   a counter circuit including Johnson-type counters of m stages, each counter including a plurality of flip-flops connected in a cascade connection, each flip-flop receiving a clock signal at a respective clock input, wherein signals at respective outputs of the plurality of flip-flops in a (k−1)-th stage counter are simultaneously input to respective clock inputs of the plurality of flip-flops in each counter of a k-th stage through m-th stage, where k≦m;

a logic gate which generates a logic sum of the clock signal and signals at respective outputs of all of the flip-flops in the counter circuit and outputs a result thereof as a m-th signal;

means for inputting a serial data in response to the clock signal and converting the serial data into a parallel data of a plurality of bits; and means for latching and outputting the parallel data in response to the m-th signal output from the individual signal generating circuit.

8. A data converting circuit comprising:
a divided signal generating circuit including:
  a counter circuit including Johnson-type counters of m stages, each counter including a plurality of flip-flops connected in a cascade connection; and (m−1) logic gates connected between each stage of the counters, wherein a clock signal is simultaneously input to respective clock inputs of the plurality of flip-flops in a first stage counter; a logic sum of the clock signal and signals at respective outputs of the plurality of flip-flops in the first stage counter is generated by a first logic gate and output as a first signal; the first signal is simultaneously input to respective clock inputs of the plurality of flip-flops in a second stage counter; a logic sum of the first signal and signals at respective outputs of the plurality of flip-flops in the second stage counter is generated by a second logic gate and output as a second signal; and, hereinafter in the like manner, signals representing logic sums are generated for input to respective clock inputs of the plurality of flip-flops of each additional stage so that a (m−1)-th signal is simultaneously input to respective clock inputs of the plurality of flip-flops in a m-th stage counter;
  a logic gate which generates a logic sum of the (m−1)-th signal and signals at respective outputs of the plurality of flip-flops in the m-th stage counter and outputs a result thereof as a m-th signal;
means for inputting a serial data in response to the clock signal and converting the serial data into a parallel data of a plurality of bits; and
means for latching and outputting the parallel data in response to the m-th signal output from the divided signal generating circuit.

9. A data converting circuit comprising:
a divided signal generating circuit including:
  a counter circuit including Johnson-type counters of m stages, each counter including a plurality of flip-flops connected in a cascade connection, each flip-flop receiving a clock signal at a respective clock input, wherein signals at respective outputs of the plurality of flip-flops in a (k−1)-th stage counter are simultaneously input to respective clock inputs of the plurality of flip-flops in each counter of a k-th stage through the m-th stage, where k≦m;
  a logic gate which generates a logic sum of the clock signal and signals at respective outputs of all of the flip-flops in the counter circuit and outputs a result thereof as a m-th signal; and means for inputting a parallel data of a plurality of bits in response to the m-th signal output from the divided signal generating circuit and converting the parallel data into a serial data in response to the clock signal, to thereby output the converted serial data.

10. A data converting circuit comprising:
a divided signal generating circuit including:
  a counter circuit including Johnson-type counters of m stages, each counter including a plurality of flip-flops connected in a cascade connection; and (m−1) logic gates connected between each stage of the counters, wherein a clock signal is simultaneously input to respective clock inputs of the plurality of flip-flops in a first stage counter; a logic sum of the clock signal and signals at respective outputs of the plurality of flip-flops in the first stage counter is generated by a first logic gate and output as a first signal; the first signal is simultaneously input to respective clock inputs of the plurality of flip-flops in a second stage counter; a logic sum of the first signal and signals at respective outputs of the plurality of flip-flops in the second stage counter is generated by a second logic gate and output as a second signal; and, hereinafter in the like manner, signals representing logic sums are generated for input to respective clock inputs of the plurality of flip-flops of each additional stage so that a (m−1)-th signal is simultaneously input to respective clock inputs of the plurality of flip-flops in a m-th stage counter;
  a logic gate which generates a logic sum of the (m−1)-th signal and signals at respective outputs of the plurality of flip-flops in the m-th stage counter and outputs a result thereof as a m-th signal; and
means for inputting a parallel data of a plurality of bits in response to the m-th signal output from the divided signal generating circuit and converting the parallel data into a serial data in response to the clock signal, to thereby output the converting serial data.

11. A counter circuit comprising:
a Johnson-type counter including a plurality of flip-flops connected in a cascade connection, each flip-flop simultaneously receiving a clock signal at a respective clock input; and
a gate means for generating a logic sum of the clock signal and signals at respective outputs of the plurality of flip-flops in the counter;
wherein the counter includes a buffer means for regulating respective times at which the clock signal and the signals at the respective outputs of each of the plurality of flip-flops are input to the gate means, non-inverting and inverting outputs of the last of the plurality of flip-flops in the cascade connection being input to data inverting and data non-inverting inputs of the first of the plurality of flip-flops in the cascade connection, respectively, and operation amplitude levels of respective differential signal outputs of the plurality of flip-flops being set to be similar than those of other, non-flip-flop circuit components.

12. A counter circuit as set forth in claim 11, wherein the buffer means comprises means for phase regulation and means for receiving respective differential signals of small amplitude from each flip-flop and amplifying the differential signals up to an amplitude level which is necessary and sufficient for the logic operation in the gate means.

13. A divided signal generating circuit comprising:
a counter circuit including Johnson-type counter of m stages, each counter including a plurality of flip-flops connected in a cascade connection, each flip-flop receiving a clock signal at a respective clock input, wherein signals at respective outputs of the plurality of flip-flops in a (k−1)-th stage counter are simultaneously input to respective clock inputs of the plurality of flip-flops in each counter of a k-th stage through m-stage, where k≦m;
wherein a first stage counter includes a buffer means for regulating respective times at which the clock signal and signals at respective outputs of each flip-flop in the first stage counter are input to respective clock inputs of the plurality of flip-flops in each counter of a second stage through the m-th stage, non-inverting and inverting outputs of the last flip-flop of the plurality of flip-flops in the cascade connection being input to data inverting and data non-inverting inputs the first flip-flop of the plurality of flip-flops in the cascade connection, respectively, and operation amplitude levels of respective differential signal outputs of the flip-flops in the first stage counter being set to be smaller than those of other, non-flip-flop circuit components.

14. A divided signal generating circuit as set forth in claim 13, further comprising a logic gate which generates a logic sum of the clock signal and signals at respective output ends of all of the flip-flops in the counter circuit and outputs a result thereof as a m-th signal.

15. A divided signal generating circuit as set forth in claim 14, wherein the buffer means comprises means for phase regulation and means for receiving respective differential signals of small amplitude from each flip-flop and amplifying the differential signals up to an amplitude level which is necessary and sufficient for the logic operation in the gate means.

16. A divided signal generating circuit as set forth in claim 15, wherein each counter of a second stage through the m-th stage comprises a gate means for simultaneously receiving the clock signal and the signals from the respective outputs of the plurality of flip-flops in each counter of the preceding stage or stages.

17. A divided signal generating circuit comprising:
a counter circuit including Johnson-type counters of m stages, each counter including a plurality of flip-flops connected in a cascade connection, and (m−1) logic gates connected between each stage of the counters, wherein a clock signal is simultaneously input to respective clock inputs of the plurality of flip-flops in a first stage counter; a logic sum of the clock signal and signals at respective outputs of the plurality of flip-flops in the first stage counter is generated by a first logic gate and output as a first signal; the first signal is simultaneously input to respective clock inputs of the plurality of flip-flops in a second stage counter; a logic sum of the first signal and signals at respective outputs of the plurality of flip-flops in the second stage counter is generated by a second logic gate and output as a second signal; and, hereinafter in the like manner, signals representing logic sums are generated for input to respective clock inputs of the plurality of flip-flops of each additional stage so that a (m−1)-th signal is simultaneously input to respective clock inputs of flip-flops in a m-th stage counter;
wherein a first stage Johnson-type counter includes a buffer means for regulating respective time at which the clock signal and signals at respective outputs of each flip-flop in the first stage counter are input to the first logic gate, non-inverting and inverting outputs of the last flip-flop of the plurality of flip-flops in the cascade connection being input to data inverting and data non-inverting inputs of the first flip-flop of the plurality of flip-flops in the cascade connection, respectively, and operation amplitude levels of respective differential signal outputs of the flip-flops in the first stage counter being set to be smaller than those of other, non-flip-flop circuit components.

18. A divided signal generating circuit as set forth in claim 17, further comprising a logic gate which generates a logic sum of the (m−1)-th signal and signals at respective output ends of the plurality of flip-flops in the m-th stage counter and outputs a result thereof as a m-th signal.

19. A divided signal generating circuit as set forth in claim 18, wherein the buffer means comprises means for phase regulation and means for receiving respective differential signals of small amplitude form each flip-flop and amplifying the differential signals up to an amplitude level which is necessary and sufficient for the logic operation in the gate means.

20. A data demultiplexer circuit comprising:
a divided signal generating circuit including:
a counter circuit including Johnson-type counters of m stages, each counter including a plurality of flip-flops connected in a cascade connection, each flip-flop receiving a clock signal at a respective clock input, wherein signals at respective outputs of the plurality of flip-flops in a (k−1)-th stage counter are simultaneously input to respective clock inputs of the plurality of flip-flops in each counter of a k-th stage through m-th stage, where k≦m; and
a logic gate which generates a logic sum of the clock signal and signals at respective outputs of all of the flip-flops in the counter circuit and outputs a result thereof as a m-th signal;
a first stage Johnson-type counter including a buffer means for regulating respective times at which the clock signal and signals at respective outputs of each flip-flop in the first stage counter are input to respective clock inputs of the plurality of flip-flops in each counter of a second stage through m-th stage, non-inverting and inverting outputs of the last flip-flop of the plurality of flip-flops in the cascade connection being input to data inverting and data non-inverting inputs of the first flip-flop of the plurality of flip-flops in the cascade connections, respectively, and operation amplitude levels of respective differential signal outputs of the plurality of flip-flops in the first stage counter being set to be smaller than those of other, non-flip-flop circuit components;
means for inputting a serial data in response to the clock signal and converting the serial data into a parallel data of a plurality of bits; and means for latching and outputting the parallel data in response to the m-th signal output from the divided signal generating circuit.

21. A data demultiplexer circuit comprising:
a divided signal generating circuit including:
a counter circuit including Johnson-type counters of m stages, each counter including a plurality of flip-flops connected in a cascade connection, and (m−1) logic gates connected between each stage of the counters, wherein a clock signal is simultaneously input to respective clock inputs of the plurality of flip-flops in a first stage counter; a logic sum of the clock signal and signals at respective outputs of the plurality of flip-flops in the first stage counter is generated by a first logic gate and output as a first signal; the first signal is simultaneously input to respective clock inputs of the plurality of flip-flops in a second stage counter; a logic sum of the first signal and signals at respective outputs of the plurality of flip-flops in the second stage counter is generated by a second logic gate and output as a second signal; and, hereinafter in the like manner, signals representing logic sums are generated for input to respective clock inputs of the plurality of flip-flops of each additional stage so that a (m−1)-th signal is simultaneously input to respective clock inputs of the plurality of flip-flops in a m-th stage counter;
a logic gate which generates a logic sum of the (m−1)-th signal and signals at respective outputs of the plurality of flip-flops in the m-th stage counter and outputs a result thereof as a m-th signal;
a first stage Johnson-type counter including a buffer means for regulating respective times at which the clock signal and signals at respective outputs of each flip-flop in the first stage counter are input to the first logic gate, non-inverting and inverting outputs of the last flip-flop of the plurality of flip-flops in the cascade connection being input to data inverting and data non-inverting inputs of the first flip-flop of the plurality of flip-flops in the cascade connection, respectively, and operation amplitude levels of respective differential signal outputs of the flip-flops in the first stage counter being set to be smaller than those of other, non-flip-flop circuit components;
means for inputting a serial data in response to the clock signal and converting the serial data into a parallel data of a plurality of bits; and
means for latching and outputting the parallel data in response to the m-th signal output from the divided signal generating circuit.

22. A data multiplexer circuit comprising:
a divided signal generating circuit including:
a counter circuit including Johnson-type counters of m stages, each counter including a plurality of flip-flops connected in a cascade connection, each flip-flop receiving a clock signal at a respective clock input, wherein signals at respective outputs of the plurality of flip-flops in a (k−1)-th stage counter are simultaneously input to respective clock inputs of the plurality of flip-flops in each counter of a k-th stage through m-th stage, where k≦m;
a logic gate which generates a logic sum of the clock signal and signals at respective outputs of all of the flip-flops in the counter circuit and outputs a result thereof as a m-th signal;
wherein a first stage counter includes a buffer means for regulating respective times at which the clock signal and signals at respective outputs of each flip-flop in the first stage counter are input to respective clock inputs of the plurality of flip-flops in each counter of a second stage through m-th stage, non-inverting and inverting outputs of the last flip-flop of the plurality of flip-flops in the cascade connection being input to data inverting and data non-inverting inputs of the first flip-flop of the plurality of flip-flop in the cascade connection, respectively, and operation amplitude levels of respective differential signal outputs of the flip-flops in the first stage counter being set to be smaller than those of other, non-flip-flop circuit components; and
means for inputting a parallel data of a plurality of bits in response to the m-th signal output from the divided signal generating circuit and converting the parallel data into a serial data in response to the clock signal, to thereby output the converted serial data.

23. A data multiplexer circuit comprising:
a divided signal generating circuit including:
a counter circuit including Johnson-type counters of m stages, each counter including a plurality of flip-flops connected in a cascade connection, and (m−1) logic gate connected between each stage of the counters, wherein a clock signal is simultaneously input to respective clock inputs of the plurality of flip-flops in a first stage counter; a logic sum of the clock signal and signals at respective outputs of the plurality of flip-flops in the first stage counter is generated by a first logic gate and output as a first signal; the first signal is simultaneously input to respective clock inputs of the plurality of flip-flops in a second stage counter; a logic sum of the first signal and signals at respective outputs of the plurality of flip-flops in the second stage counter is generated by a second logic gate and output as a second signal; and, hereinafter in the like manner, signals representing logic sums are generated for input to respective clock inputs of the plurality of flip-flops of each additional stage so that a (m−1)-th signal is simultaneously input to respective clock inputs of the plurality of flip-flops in a m-th stage counter;
a logic gate which generates a logic sum of the (m−1)-th signal and signals at respective outputs of the plurality of flip-flops in the m-th stage counter and outputs a result thereof as a m-th signal;
wherein a first stage Johnson-type counter includes a buffer means for regulating respective times at which the clock signal and signals at respective outputs of each flip-flop in the first stage counter are input to the first logic gate, non-inverting and inverting outputs of the last flip-flop of the plurality of flip-flops in the cascade connection being input to data inverting and data non-inverting inputs of the first flip-flop of the plurality of flip-flops in the cascade connection, respectively, and operation amplitude levels of respective differential signal outputs of the flip-flops in the first stage counter being set to be smaller than those of other, non-flip-flop circuit components; and means for inputting a parallel data of a plurality of bits in response to the m-th signal output from the divided signal generating circuit and converting the parallel data into a serial data in response to the clock signal, to thereby output the converted serial data.

* * * * *

UNITED STATES PATENT AND TRADEMARK OFFICE
CERTIFICATE OF CORRECTION

PATENT NO. : 5,321,733

DATED : June 14, 1994

INVENTOR(S) : Masaya TAMAMURA, et al.

It is certified that error appears in the above-indentified patent and that said Letters Patent is hereby corrected as shown below:

Title Page: [57] - Abstract, line 1, delete "m" and insert therefor --$\underline{m}$--.

Col. 1, line 8, delete ", and" and insert therefor --and,--;
Line 21, after "been", delete the comma (",");
Line 38, insert --a-- after "," (comma)
Line 47, after "each", delete the comma (",");
Line 49, after "and", insert a comma (",");
Line 58, delete "with".

Col. 2, line 1, delete "m" and insert therefor --$\underline{m}$--;
Line 10, delete "m" and insert therefor --$\underline{m}$--;
Line 25, delete "Of" and insert therefor --of--;
Line 40, after "flip-", insert --flop being input to data inverting and data non---.

Col. 4, line 48, delete ", and" and insert therefor --and,--;
Line 63, insert a comma after each of "and" and "result", respectively;
Line 65, delete ", and" and insert therefor --and,--.

Col. 6, line 35, delete "m" and insert therefor --$\underline{m}$--;
Line 51, after "thereof", insert a comma (",");
Line 56, delete "m stage" and insert therefor --$\underline{m}$ stages--.

Col. 7, line 1, delete "signals" and insert therefor --signal $S_1$--;
Line 14, delete "as", second occurrence, and insert therefor --, outputs--;
Line 46, after "QX", delete the period (".") and insert therefor --, respectively,--;
Line 50, delete ", GT" and insert therefor --GT,--;
Line 65, delete "m" and insert therefor --$\underline{m}$--.

Col. 8, line 43, after "17", insert a comma (",").

UNITED STATES PATENT AND TRADEMARK OFFICE
CERTIFICATE OF CORRECTION

PATENT NO. : 5,321,733
DATED : June 14, 1994
INVENTOR(S) : Masaya TAMAMURA, et al.

It is certified that error appears in the above-indentified patent and that said Letters Patent is hereby corrected as shown below:

Col. 10, line 18, insert "," after --$JC_1$--; and delete "," after "$FF_{12}$", instead of inserting in column 11, line 25.
    Line 18, after "stage", delete the period (".");
    Line 18, after "JC", insert a comma (",");
    Line 37, after "20,", insert --elapsed--;
    Line 39, delete "1/6" and insert therefor --1/16--;
    Line 66, after "all", delete the comma (",");
    Line 67, after "thereof", insert a comma (",").
Col. 11,
    Line 27, delete the extra space between "FF" and "$_{22}$";
    Line 28, delete "$JCC_{22}$" and insert therefor --$JCC_2$--;
    Line 63, after "$FF_{22}$", delete the comma (",").
Col. 12, line 29, after "signal", delete the comma (",");
    Line 61, after "$FF_{12}$", delete the comma (",").
Col. 13, line 66, delete "wherein" and insert therefor --where--.
Col. 15, lines 14 and 15, delete "individ- ual" and insert therefor --divided--.
Col. 17, line 24, after "inputs", insert --of--.
Col. 18, line 29, delete "form" and insert therefor --from--;
    Line 61, delete "connections" and insert therefor --connection--.

UNITED STATES PATENT AND TRADEMARK OFFICE
CERTIFICATE OF CORRECTION

PATENT NO. : 5,321,733

DATED : June 14, 1994

INVENTOR(S) : Masaya TAMAMURA, et al.

It is certified that error appears in the above-indentified patent and that said Letters Patent is hereby corrected as shown below:

Col. 20, line 15, delete "flip-flop" and insert therefor --flip-flops--.

Signed and Sealed this

Fifteenth Day of November, 1994

Attest:

BRUCE LEHMAN

Attesting Officer

Commissioner of Patents and Trademarks